United States Patent
Nishizuka et al.

(10) Patent No.: US 8,980,048 B2
(45) Date of Patent: Mar. 17, 2015

(54) PLASMA ETCHING APPARATUS

(71) Applicant: Tokyo Electron Limited, Tokyo (JP)

(72) Inventors: Tetsuya Nishizuka, Beaverton, OR (US); Masahiko Takahashi, Beaverton, OR (US); Toshihisa Ozu, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/265,555

(22) Filed: Apr. 30, 2014

(65) Prior Publication Data

US 2014/0231017 A1 Aug. 21, 2014

Related U.S. Application Data

(62) Division of application No. 13/128,951, filed as application No. PCT/JP2009/069218 on Nov. 11, 2009.

(30) Foreign Application Priority Data

Nov. 13, 2008 (JP) .................. 2008-291370

(51) Int. Cl.
*H01L 21/67* (2006.01)
*H01J 37/32* (2006.01)
*H01L 21/3065* (2006.01)
*H01L 21/762* (2006.01)

(52) U.S. Cl.
CPC ..... *H01L 21/67069* (2013.01); *H01J 37/32192* (2013.01); *H01L 21/3065* (2013.01); *H01L 21/76229* (2013.01)
USPC .................................................. 156/345.41

(58) Field of Classification Search
None
See application file for complete search history.

(56) References Cited

U.S. PATENT DOCUMENTS

| 5,614,060 | A | 3/1997 | Hanawa |
| 6,110,287 | A | 8/2000 | Arai et al. |
| 6,660,647 | B1 | 12/2003 | Ono et al. |
| 7,138,767 | B2 | 11/2006 | Chen et al. |

(Continued)

FOREIGN PATENT DOCUMENTS

| JP | 11-297679 | 10/1999 |
| JP | 2000-091321 | 3/2000 |

(Continued)

OTHER PUBLICATIONS

International Search Report mailed on Dec. 15, 2009.

*Primary Examiner* — Allan Olsen
(74) *Attorney, Agent, or Firm* — IPUSA, PLLC

(57) ABSTRACT

A plasma etching apparatus includes a process chamber, a susceptor, microwave permeable plate that is made of a dielectric material that allows microwaves to pass therethrough, a microwave supplying portion including a microwave generation apparatus that generates microwaves of a predetermined frequency, a gas supplying portion for supplying a process gas, an evacuation portion, a bias electric power supplying portion; and an alternating bias electric power control portion that controls the alternating bias electric power, wherein the alternating bias electric power control portion controls the alternating bias electric power so that supplying and disconnecting the alternating bias electric power to the susceptor are repeated to allow a ratio of a time period of supplying the alternating bias electric power with respect to a total time period of supplying the alternating bias electric power and disconnecting the alternating bias electric power to be 0.1 or more and 0.5 or less.

5 Claims, 15 Drawing Sheets

(56) References Cited

U.S. PATENT DOCUMENTS

| | | |
|---|---|---|
| 7,264,688 B1 | 9/2007 | Paterson et al. |
| 7,268,084 B2 | 9/2007 | Chen et al. |
| 7,396,431 B2 | 7/2008 | Chen et al. |
| 7,584,714 B2 | 9/2009 | Chen et al. |
| 7,780,864 B2 | 8/2010 | Paterson et al. |
| 7,871,828 B2 | 1/2011 | Cho et al. |
| 7,938,081 B2 | 5/2011 | Chen et al. |
| 7,939,141 B2 | 5/2011 | Matthewa et al. |
| 7,998,307 B2 | 8/2011 | Chen et al. |
| 2001/0006849 A1 | 7/2001 | Suzuki |
| 2002/0125207 A1 | 9/2002 | Ono et al. |
| 2003/0132198 A1 | 7/2003 | Ono et al. |
| 2004/0124177 A1 | 7/2004 | Urban et al. |
| 2004/0195216 A1 | 10/2004 | Strang |
| 2006/0065367 A1 | 3/2006 | Chen et al. |
| 2006/0065621 A1 | 3/2006 | Chen et al. |
| 2006/0065629 A1 | 3/2006 | Chen et al. |
| 2006/0071607 A1 | 4/2006 | Chen et al. |
| 2006/0081558 A1 | 4/2006 | Collins et al. |
| 2007/0048954 A1 | 3/2007 | Kato et al. |
| 2007/0175856 A1 | 8/2007 | Johnson et al. |
| 2008/0060759 A1 | 3/2008 | Chen et al. |
| 2008/0060760 A1 | 3/2008 | Chen et al. |
| 2008/0138996 A1 | 6/2008 | Nishizuka |
| 2009/0317566 A1* | 12/2009 | Nishimoto ............... 427/575 |
| 2010/0175713 A1* | 7/2010 | Fukiage et al. ........... 134/1.1 |
| 2010/0275981 A1 | 11/2010 | Ohmi et al. |
| 2011/0121058 A1* | 5/2011 | Nishimoto ............... 228/121 |
| 2012/0071005 A1* | 3/2012 | Shimizu ................... 438/786 |
| 2012/0160809 A1* | 6/2012 | Ishibashi et al. ........... 216/69 |
| 2013/0072033 A1* | 3/2013 | Kohno et al. ............. 438/792 |
| 2013/0154059 A1* | 6/2013 | Ohmi et al. ............... 257/607 |
| 2013/0292047 A1* | 11/2013 | Tian et al. ................. 156/242 |

FOREIGN PATENT DOCUMENTS

| | | |
|---|---|---|
| JP | 2006-156675 | 6/2006 |
| JP | 2007-080982 | 3/2007 |
| JP | 2007-250570 | 9/2007 |
| WO | WO 2006/064898 | 6/2006 |

* cited by examiner (a)

(b)

(a)

(b)

(a)

(b)

(a)

(b)

(a)

(b)

(c)

(d)

(a)

(b)

(a)

(b)

(c)

(d)

(a)

(b)

(a)

(b)

(a)

(b)

PLASMA ETCHING APPARATUS

CROSS-REFERENCE TO RELATED APPLICATION

This application is a divisional patent application of, and claims the benefit of and priority to, U.S. patent application Ser. No. 13/128,951 filed on Jun. 20, 2011, which is a National Stage application of PCT Application No. PCT/JP2009/069218, filed Nov. 11, 2009, and claims the benefit of priority of Japanese Patent Application No. 2008-291370, filed on Nov. 13, 2008, with the Japanese Patent Office, all of which are hereby incorporated by reference.

TECHNICAL FIELD

The present invention relates to a plasma etching method and a plasma etching apparatus, and specifically to a plasma etching method and a plasma etching apparatus that are capable of realizing the same depth and profile plasma etching regardless of etching pattern densities.

BACKGROUND ART

In recent years, a design rule of a semiconductor device that constitutes a Large Scale Integrated (LSI) circuit has been increasingly shrinking from a requirement for higher integration and higher operational speed of the LSI. When a large number of semiconductor devices are formed in a chip, each of the semiconductor devices needs to be electrically isolated so that the semiconductor devices do not adversely affect one another. As a device isolation technology for forming a device isolation structure, a Sallow Trench Isolation (STI) process has been known. In the STI process, a groove (trench) is formed by anisotropically etching an upper surface of a silicon substrate (semiconductor wafer); the groove is filled with an insulating material such as silicon oxide; and the insulating material is planarized, so that the semiconductor devices are isolated with the insulating material so formed. The STI process is advantageous in that only a small area is needed, which enables further miniaturization, compared to a Local Oxidation of Silicon (LOCOS) process.

Referring to FIG. 1, a trench forming step in the STI process is explained. First, after a thin insulating film such as a silicon oxide ($SiO_2$) film or a silicon nitride (SiN) film is formed on a silicon substrate (a semiconductor wafer) 211, the insulating film is patterned by photolithography and etching, as shown in FIG. 1(a), thereby obtaining an etching mask 212 to be used for etching the semiconductor wafer 211. Next, the semiconductor wafer 211 is etched using the etching mask 212, as shown in FIG. 1(b), thereby forming a shallow trench.

In this etching process, generally, an etching gas is activated by plasma, and the semiconductor wafer 211 on which the etching mask 212 is formed is exposed to the activated etching gas, so that a predetermined pattern is formed.

While there are an Electron Cyclotron Resonance method and a parallel plate method as a method for generating plasma, a microwave plasma apparatus employing a microwave plasma method that uses microwaves to generate high density plasma is widely used because plasma can be stably generated even in a relatively low pressure vacuum environment of 0.1 mTorr (13.3 mPa) to several tens mTorr (several Pa) by the microwave plasma method. Specifically, a plasma etching apparatus employing a Radial Line Slot Antenna (RLSA) microwave plasma method is used, because the electron temperature is low despite the high plasma density and plasma density uniformity being excellent, so that uniform etching is realized while reducing damage on the substrate to be etched (See Patent Document 1, for example).

In this case, when high frequency electric power having a radio frequency (RF) is applied to a susceptor on which the semiconductor wafer is placed as alternating bias electric power, if needed, the ions generated by the plasma can be pulled toward the upper surface of the semiconductor wafer, thereby efficiently performing the etching (See Patent Document 2, for example).

Patent Document 1: International Publication Pamphlet No. 06/064898.

Patent Document 2: Japanese Patent Application Laid-Open Publication No. 2006-156675.

SUMMARY OF INVENTION

Problems to be Solved by the Invention

However, there is a following problem when forming the trench in the semiconductor wafer using the plasma etching method and the plasma etching apparatus. On the semiconductor wafer, there are a "high density" area where narrow grooves (trenches) are formed in a higher concentration (See a portion D shown in FIG. 1(a), for example) and a "low density" area where wide grooves (trenches) are formed in a lower concentration (See a portion I shown in FIG. 1(a), for example). There is a problem in that etching profiles between the high density area and the low density area are different (or profile differences due to pattern densities).

Especially, there is tendency that a bottom surface of the groove (trench) is not flat so that the center part of the bottom is raised compared to edge parts of the bottom (See "Ts" shown in FIG. 1(b)), thereby leaving a convex bottom surface (or sub-trench shape). Such tendency is more significant in the area having a low pattern density.

As a main cause for such a sub-trench shape, adsorption of by-products of etching reaction can be pointed out. In order to avoid such adsorption, an etching gas flow rate and an evacuation rate of a process chamber need to be increased, and this may cause another problem.

Moreover, a so-called side etching is caused where a trench width of the groove (trench) becomes wider toward an upper edge of the trench in a relatively low pressure range of several 10 mTorr or less, and thus there is a problem in terms of profile controllability.

The present invention has been made in view of the above, and provides a plasma etching method and a plasma etching apparatus that are capable of yielding the same depth and profile in plasma etching regardless of pattern densities, without increasing an etching gas flow rate and an evacuation rate of a process chamber.

Means of Solving the Problems

A first aspect of the present invention provides a plasma etching method using a plasma etching apparatus including a process chamber whose inside is evacuatable to vacuum and that has an openable ceiling portion; a susceptor on which an object to be processed is placed, the susceptor being provided in the process chamber; a microwave permeable plate that is made of a dielectric material that allows microwaves to pass therethrough and is attached to an opening of the ceiling portion in an air-tight manner; a microwave supplying portion including a microwave generation apparatus that generates microwaves of a predetermined frequency, a mode converter that is connected to the microwave generation apparatus via a rectangular waveguide pipe and a matching circuit and converts an oscillation mode of the generated microwaves into a predetermined mode, a coaxial waveguide pipe that allows the microwaves having the predetermined mode to propagate therein, an electrically conductive chassis that is connected to an outer electrical conductive body of the coaxial waveguide pipe, a slot plate that is made of a conductive material and has plural through holes, wherein the slot plate is arranged in an upper surface of the microwave permeable plate and a center electrically conductive material is connected to a center portion of the slot plate, and a dielectric plate that is made of a dielectric material and arranged between the slot plate and the chassis; a gas supplying portion that supplies a process gas to the process chamber; an evacuation portion that maintains the inside of the process chamber at a predetermined pressure; a bias electric power supplying portion that supplies alternating bias electric power to the susceptor; and an alternating bias electric power control portion that controls the alternating bias electric power. The plasma etching method comprises causing the alternating bias electric power control portion to control the alternating bias electric power so that supplying and disconnecting the alternating bias electric power to the susceptor are alternately repeated to allow a ratio of a time period of supplying the alternating bias electric power with respect to a total time period of supplying the alternating bias electric power and disconnecting the alternating bias electric power to be 0.1 or more and 0.5 or less.

A second aspect of the present invention provides a plasma etching apparatus comprising a process chamber whose inside is evacuatable to vacuum and that has an openable ceiling portion; a susceptor on which an object to be processed is placed, the susceptor being provided in the process chamber; a microwave permeable plate that is made of a dielectric material that allows microwaves to pass therethrough and is attached to an opening of the ceiling portion in an air-tight manner; a microwave supplying portion including a microwave generation apparatus that generates microwaves of a predetermined frequency, a mode converter that is connected to the microwave generation apparatus via a rectangular waveguide pipe and a matching circuit and converts an oscillation mode of the generated microwaves into a predetermined mode, a coaxial waveguide pipe that allows the microwaves having the predetermined mode to propagate therein, an electrically conductive chassis that is connected to an outer electrical conductive body of the coaxial waveguide pipe, a slot plate that is made of a conductive material and has plural through holes, wherein the slot plate is arranged in an upper surface of the microwave permeable plate and a center electrically conductive material is connected to a center portion of the slot plate, and a dielectric plate that is made of a dielectric material and arranged between the slot plate and the chassis; a gas supplying portion that supplies a process gas to the process chamber; an evacuation portion that maintains the inside of the process chamber at a predetermined pressure; a bias electric power supplying portion that supplies alternating bias electric power to the susceptor; and an alternating bias electric power control portion that controls the alternating bias electric power. The alternating bias electric power control portion controls the alternating bias electric power so that supplying and disconnecting the alternating bias electric power to the susceptor are repeated to allow a ratio of a time period of supplying the alternating bias electric power with respect to a total time period of supplying the alternating bias electric power and disconnecting the alternating bias electric power to be 0.1 or more and 0.5 or less.

A third aspect of the present invention provides a plasma etching method using a plasma etching apparatus including a process chamber whose inside is evacuatable to vacuum and that has an openable ceiling portion; a susceptor on which an object to be processed is placed, the susceptor being provided in the process chamber; a microwave permeable plate that is made of a dielectric material that allows microwaves to pass therethrough and is attached to an opening of the ceiling portion in an air-tight manner; a microwave supplying portion including a microwave generation apparatus that generates microwaves of a predetermined frequency, a mode converter that is connected to the microwave generation apparatus via a rectangular waveguide pipe and a matching circuit and converts an oscillation mode of the generated microwaves into a predetermined mode, a coaxial waveguide pipe that allows the microwaves having the predetermined mode to propagate therein, an electrically conductive chassis that is connected to an outer electrical conductive body of the coaxial waveguide pipe, a slot plate that is made of a conductive material and has plural through holes, wherein the slot plate is arranged in an upper surface of the microwave permeable plate and a center electrically conductive material is connected to a center portion of the slot plate, and a dielectric plate that is made of a dielectric material and arranged between the slot plate and the chassis; a gas supplying portion that supplies a process gas to the process chamber; an evacuation portion that maintains the inside of the process chamber at a predetermined pressure; a bias electric power supplying portion that supplies an alternating bias electric power to the susceptor; alternating bias electric power control portion that controls the alternating bias electric power. The plasma etching method comprises causing the alternating bias electric power control portion to control the alternating bias electric power so that a time period during which the alternating bias electric power is supplied at a first electric power and a time period during which the alternating bias electric power is supplied at a second electric power that is less than the first electric power are alternately repeated to allow a ratio of the time period during which the alternating bias electric power is supplied at a first electric power with respect to a total of the time period during which the alternating bias electric power is supplied at the first electric power and the time period during which the alternating bias electric power is supplied at the second electric power to be 0.1 or more and 0.5 or less.

A fourth aspect of the present invention provides a plasma etching method using a plasma etching apparatus including a process chamber whose inside is evacuatable to vacuum and that has an openable ceiling portion; a susceptor on which an object to be processed is placed, the susceptor being provided in the process chamber; a microwave permeable plate that is made of a dielectric material that allows microwaves to pass therethrough and is attached to an opening of the ceiling portion in an air-tight manner; a microwave supplying portion including a microwave generation apparatus that generates microwaves of a predetermined frequency, a mode converter that is connected to the microwave generation apparatus via a rectangular waveguide pipe and a matching circuit and converts an oscillation mode of the generated microwaves into a predetermined mode, a coaxial waveguide pipe that allows the microwaves having the predetermined mode to propagate therein, an electrically conductive chassis that is connected to an outer electrical conductive body of the coaxial waveguide pipe, a slot plate that is made of a conductive material and has plural through holes, wherein the slot plate is arranged in an upper surface of the microwave permeable plate and a center electrically conductive material is connected to a center portion of the slot plate, and a dielectric plate that is made of a dielectric material and arranged between the slot plate and the chassis; a gas supplying portion that supplies a process gas to the process chamber; an evacuation portion that maintains the inside of the process chamber at a predetermined pressure; a bias electric power supplying portion that supplies an alternating bias electric power to the susceptor; and an alternating bias electric power control portion that controls the alternating bias electric power. The plasma etching method comprises causing the alternating bias electric power control portion to control the alternating bias electric power so that a time period during which the alternating bias electric power is supplied at a first electric power and a time period during which the alternating bias electric power is supplied at a second electric power that is less than the first electric power are alternately repeated to allow a ratio of the time period during which the alternating bias electric power is supplied at a first electric power with respect to a total of the time period during which the alternating bias electric power is supplied at the first electric power and the time period during which the alternating bias electric power is supplied at the second electric power to be 0.1 or more and 0.5 or less.

MODE(S) FOR CARRYING OUT THE INVENTION

Figure 1:
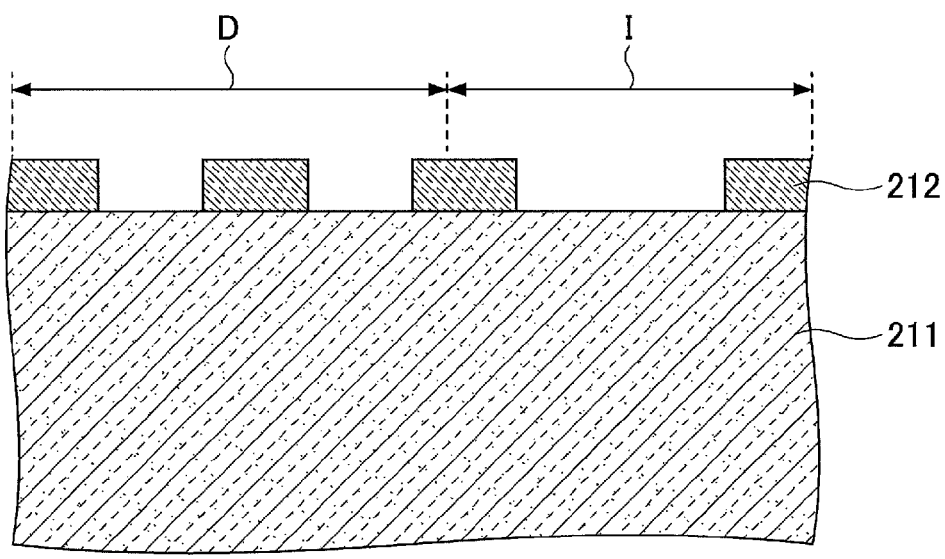
FIG. 1 schematically illustrates cross sections of a substrate before and after an etching process in a conventional etching method.
Figure 1:
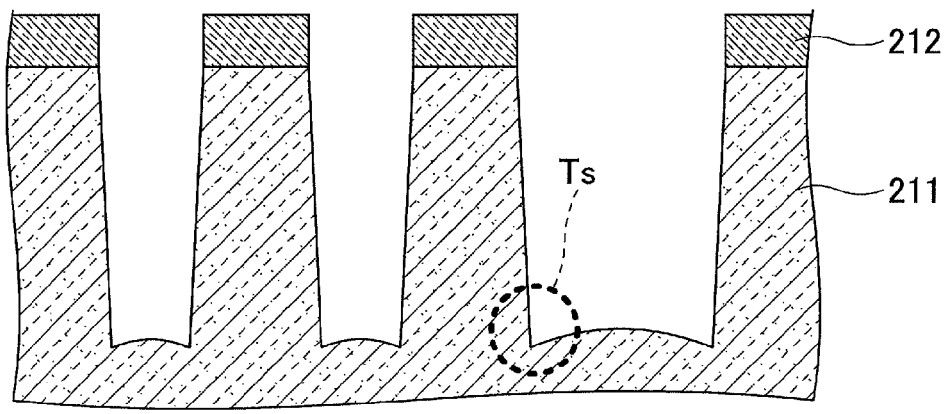

According to embodiments of the present invention, there are provided a plasma etching method and a plasma etching apparatus that are capable of yielding the same depth and profile in plasma etching regardless of pattern densities, without increasing an etching gas flow rate and an evacuation rate of a process chamber.

Non-limiting, exemplary embodiments of the present invention will now be described with reference to the accompanying drawings. In the drawings, the same or corresponding reference symbols are given to the same or corresponding members or components. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

Figure 2:
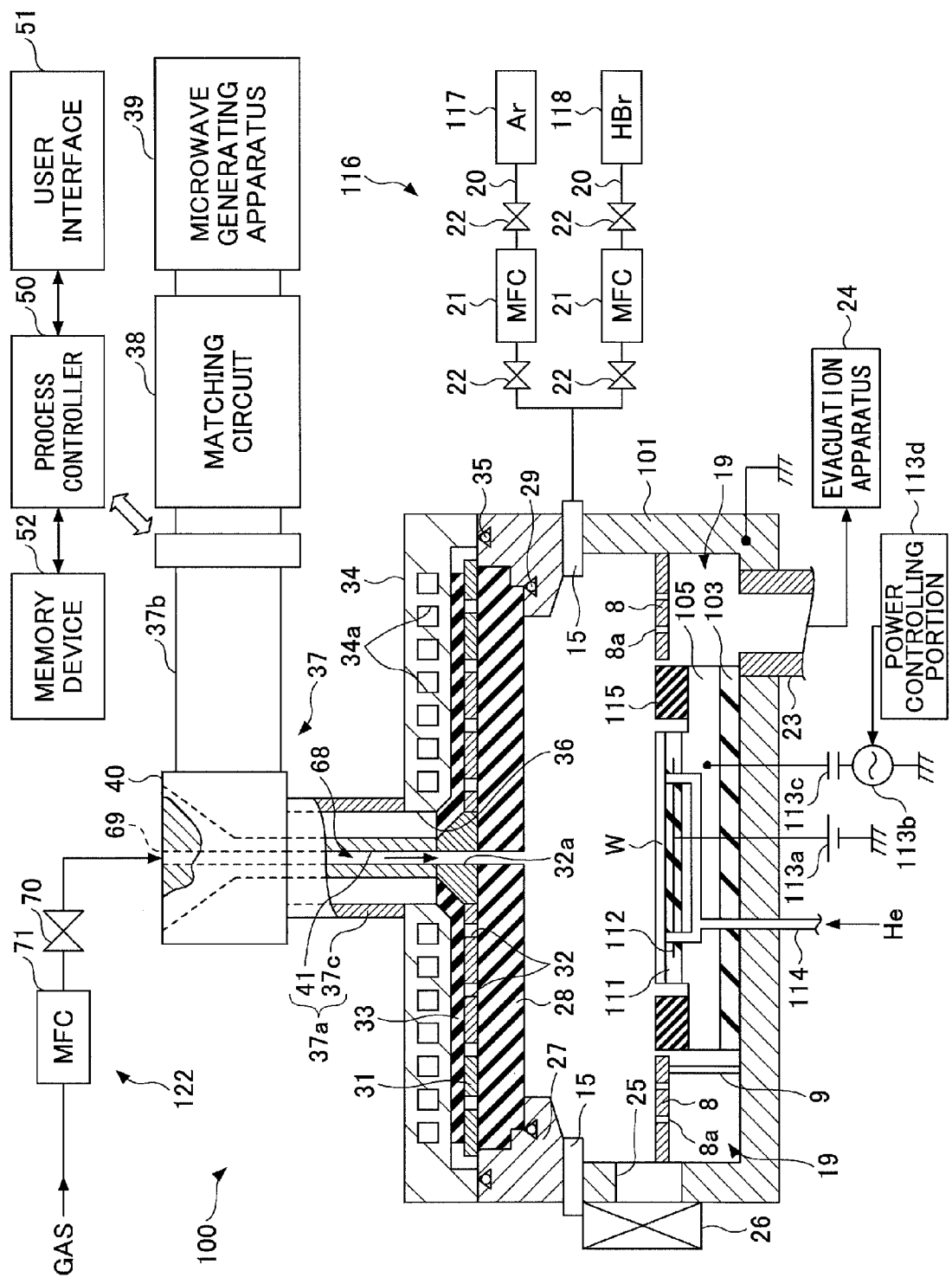
FIG. 2 is a cross-sectional view schematically illustrating an example of a plasma etching apparatus according to an embodiment of the present invention.
Figure 3:
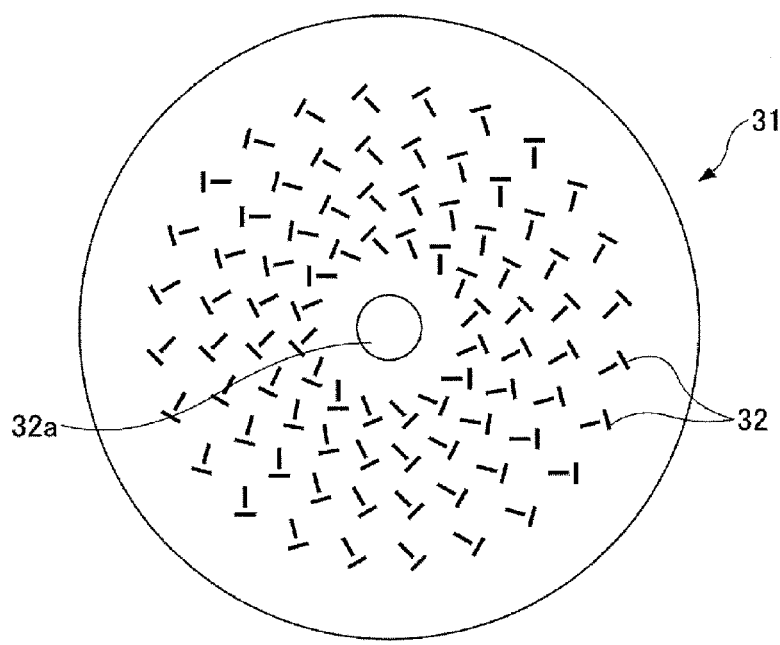
FIG. 3 is a plan view illustrating a slot plate of the plasma etching apparatus according to an embodiment of the present invention.

FIG. 2 is a cross-sectional view that schematically illustrates a plasma etching apparatus according to the present invention. FIG. 3 is a plan view illustrating a slot plate to be used in the plasma etching apparatus according to this embodiment.

A microwave plasma processing apparatus 100 according to this embodiment is configured as a Radial Line Slot Antenna microwave plasma etching apparatus where high density microwave plasma having a low electron temperature can be generated by introducing microwaves into a process chamber using a slotted plate having plural slots, specifically a RLSA as a planar antenna.

The plasma etching apparatus 100 is provided with a process chamber 101 and a susceptor 105, a microwave permeable plate 28, a microwave supplying portion, a gas supplying portion, an evacuation apparatus 24, a bias electric power supplying portion, and a bias electric power controlling portion 113d. The microwave supplying portion includes a microwave generator 39, a mode converter 40, a coaxial waveguide pipe 37a, a shield lid body 34, a slot plate 31, and a wavelength shortening member 33. The gas supplying portion includes a first gas supplying portion 116, and a second gas supplying portion 122. The bias electric power supplying portion includes an alternating current power supplier 113b.

The process chamber 101, of which a side wall and a bottom portion are configured of an electrically conductive material such as aluminum (Al), has a shape of a cylinder. The process chamber 101 is electrically grounded. Incidentally, a shape of the process chamber 101 may be a rectangular (square-like) cylinder rather than a cylinder.

Inside the process chamber 101, the susceptor 105 having a shape of a circular plate, on which a semiconductor wafer (wafer W, hereinafter) as an object to be processed is placed, is provided. The susceptor 105 includes a pedestal having a convex circular plate shape, of which an upper center portion protrudes in a convex shape, and an electrostatic chuck 111 that has substantially the same shape as the wafer W and is provided on the pedestal. The electrostatic chuck 111 is configured of insulating materials with an electrode 112 interposed therebetween, and electrostatically holds the wafer W by Coulomb force by supplying direct current electric power to the electrode 112 from a direct electric power supplier 113a. In addition, the alternating current power supplier 113b serving as an alternating current bias electric power supplying portion is connected to the susceptor 105 via a capacitor 113c. A frequency of the alternating current bias electric power supplied by the alternating current power supplier 113b is mainly 13.56 MHz, but may be 800 kHz or 2 MHz.

In addition, a baffle plate 8 having plural evacuation holes 8a is provided around the susceptor 105 in order to evacuate the process chamber 101. Below the baffle plate 8, an evacuation space 19 is formed in order to surround the susceptor 105, and the evacuation space is in gaseous communication with the evacuation apparatus 24 via an evacuation pipe 23, thereby uniformly evacuating the process chamber 101.

In addition, a temperature controlling medium chamber (not shown) is provided inside the susceptor 105. By circulating a temperature controlling medium in the temperature controlling medium chamber, the susceptor 105 can be adjusted at a predetermined temperature. Specifically, a gas passage 114 for supplying a heat conducting medium, for example, helium (He) gas at a predetermined pressure to a back surface of the wafer W is formed in an insulating plate 103, the susceptor 105, and the electrostatic chuck 111. Heat is transferred between the susceptor 105 and the wafer W by the heat conducting medium, thereby maintaining the wafer W at a predetermined temperature.

A ring-shaped focus ring 115 is provided on an upper circumferential portion of the susceptor 105 in order to surround the wafer W placed on the electrostatic chuck 111. The focus ring 115 is formed of an insulating material such as a ceramic material or quartz, and is capable of improving etching uniformity.

A resistive thermal heater serving as a heating portion is provided inside the susceptor 105, so that the wafer W is heated as appropriate.

A gas introducing member 15 having a ring shape is provided in the side wall of the process chamber 101, and the first gas supplying portion 116 is connected to the gas introducing member 15. Incidentally, the gas introducing member 15 may have a showerhead shape rather than the ring shape. The first gas supplying portion 116 includes a gas supplying source for supplying a gas depending on a process. A kind of the gas is not limited. In this embodiment, there are an Ar gas supplying source 117 and an HBr gas supplying source 118. Corresponding gases reach the gas introducing member 15 via corresponding gas lines 20 and are introduced in the process chamber 101 from the gas introducing member 15. Incidentally, each of the gas lines 20 is provided with a mass flow controller 21 and open/close valves 22 before and after the mass flow controller 21.

The evacuation pipe 23 is connected to the evacuation space 19 and to the evacuation apparatus 24 that includes a high speed vacuum pump and a pressure controlling valve (not shown) serving as an evacuation portion and a pressure controlling portion, respectively.

There are provided a transfer opening 25 through which the wafer W and a dummy wafer Wd are transferred between a transfer chamber (not shown) provided adjacent to the plasma etching apparatus 100, and a gate valve 26 that opens or closes the transfer opening 25, on the side wall of the process chamber 101.

The process chamber 101 has an opening open upward, and a ring-shaped supporting portion 27 is provided along the circumference of the opening 25. The microwave permeable plate 28, which may be made of a dielectric material such as quartz, $Al_2O_3$, and AlN, is attached in an air-tight manner to the supporting portion 27. With this, the process chamber 101 is maintained in an air-tight manner. In addition, the supporting portion 27 is made of, for example, aluminum alloy or stainless steel.

The slot plate 31 having a shape of a circular plate is provided on an upper surface of the microwave permeable plate 28. Incidentally, the slot plate 31 may have a shape of a rectangular plate (square plate). The slot plate 31 is attached to the process chamber 101 in such a manner that a circumferential portion of the slot plate 31 is supported by an upper circumference of the process chamber 101. The slot plate 31 is made of, for example, a copper plate, a nickel plate, or an aluminum plate, and an upper surface of the slot plate 31 is plated with, for example, silver or gold. In addition, plural microwave emitting holes 32 and a through-hole 32a are formed in the slot plate 31. Each of the microwave emitting holes 32 has a shape of a longwise groove (slot) and is arranged to be in a T-shape along with an adjacent one of the microwave emitting holes 32. These plural microwave emitting holes 32 are arranged in concentric circles. In addition, the microwave emitting holes 32 may be arranged, for example, in a spiral or a radial manner, or along another shape such as a circle, an arc, or the like. On the other hand, the through-hole 32a is formed substantially in the center portion of the slot plate 31, in order to constitute a gas passage 68 that extends from a gas introducing inlet 69 (described later) to an upper space of the wafer W in the process chamber 101.

Referring again to FIG. 2, the mode converter is connected to the microwave generator 39 that generates microwaves having a predetermined frequency via a rectangular waveguide pipe 37b and a matching circuit 38. The mode converter 40 converts an oscillation mode of the microwaves generated by the microwave generator 39 into a predetermined oscillation mode. The coaxial waveguide pipe 37a allows the microwaves having the predetermined oscillation mode to propagate therethrough. The shield lid body 34 serving as a chassis is made of an electrically conductive material, and is connected to an outer electrically conductive member 37c of the coaxial waveguide pipe 37a. In addition, a center electrically conductive member 41 is connected to the center portion of the slot plate 31.

The wavelength shortening member 33 that serves as a dielectric plate and has a dielectric constant greater than a vacuum dielectric constant is provided on an upper surface of the slot plate 31. The wavelength shortening member 33 has a function of shortening a wavelength of the microwaves. Note that the wavelength of the microwaves is longer in vacuum. Incidentally, the slot plate 31 may contact the microwave permeable plate 28, and the wavelength shortening member 33 may contact the slot plate 31. The shield lid body 34, which is made of, for example, an electrically conductive material such as metal including aluminum, stainless steel, or the like is provided in order to surround the slot plate 31 and the wavelength shortening member 33 on the upper surface of the process chamber 101. Namely, the wavelength shortening member 33 is arranged between the slot plate 31 and the shield lid body 34. The shield lid body 34 and the upper surface of the process chamber 101 are sealed by a sealing member 35. Plural cooling water paths 34a are formed in the shield lid body 34. By flowing cooling water through the cooling water paths 34a, the slot plate 31, the microwave permeable plate 28, the wavelength shortening member 33, and the shield lid body 34 can be cooled. Incidentally the shield lid body 34 is electrically grounded.

An opening 36 is formed in a center portion of the shield lid body 34. The waveguide pipe 37 is connected to the opening 36. As explained before, the microwave generator 39 is connected to the edge portion of the waveguide pipe 37. With this, the microwaves having a frequency of, for example, 2.45 GHz generated by the microwave generator 39 propagate to the slot plate 31 through the waveguide pipe 37. Incidentally, the frequency of the microwaves generated by the microwave generator 39 may be 8.3 GHz, 1.98 GHz, or the like.

The waveguide pipe 37 includes the coaxial waveguide pipe 37a that extends upward from the opening 36 of the shield lid body 34, and the rectangular waveguide pipe 37b that is connected to the upper end portion of the coaxial waveguide pipe 37a. The mode converter 40 between the coaxial waveguide pipe 37a and the rectangular waveguide pipe 37b has a function of converting a TE mode of the microwaves propagating through the rectangular waveguide pipe 37b into a TEM mode. The center electrically conductive member 41 extends in the center of the coaxial waveguide pipe 37a, and the center electrically conductive member 41 is connected at the lower end portion to the center of the slot plate 31. With this, the microwaves reach the wavelength shortening member 33 through a space that is inside the coaxial waveguide pipe 37a and outside the center electrically conductive member 41, propagate in a radial direction in the wavelength shortening member 33 interposed between the shield lid body 34 and the slot plate 31, and further propagate to the microwave permeable plate 28 through the microwave emitting holes 32 formed in the slot plate 31. On the other hand, an outer electrically conductive member 37c extends outside the coaxial waveguide pipe 37a, and the lower end portion of the outer electrically conductive member 37c is connected to and fixed onto the shield lid body 34, which is electrically conductive.

The plasma etching apparatus 100 according to this embodiment is provided with the second gas supplying portion 122 in addition to the first gas supplying portion 116 connected to the gas introducing member 15. Specifically, the second gas supplying portion 122 includes the gas passage 68 that is formed in order to go through the center electrically conductive member 41 of the coaxial waveguide pipe 37a, the slot plate 31, and the microwave permeable plate 28 and thus to be in gaseous communication with the process chamber 101. Namely, in the shield lid body 34, the gas passage 68 is defined by the center electrically conductive member 41 of the coaxial waveguide pipe 37a, which is inserted into the opening 36 of the shield lid body 34 and connected to the slot plate 31.

The second gas supplying portion 122 in the middle of which an open/close valve 70, a mass flow controller 71, and the like are provided, is connected to the gas introducing inlet 69 formed at the upper end portion of the center electrically conductive member 41, and a desired gas can be supplied at a controlled flow rate as appropriate.

Each of the constituting parts of the microwave plasma processing apparatus 100 is connected to and controlled by a process controller 50 to which a user interface 51 is connected, which is composed of a keyboard for a process supervisor to input commands or the like in order to manage the microwave plasma processing apparatus 100, a display that shows operations of the microwave plasma processing apparatus 100, or the like.

In addition, a memory device 52, which stores a control program (software) for causing various processes to be performed in the microwave plasma processing apparatus 100 under control of the process controller 50, and a process recipe including process condition data, or the like, is connected to the process controller 50.

An arbitrary recipe is called out from the memory device 52 by instruction or the like from the user interface 51, if necessary, and executed by the process controller 50, so that a desired process can be performed under control of the process controller 50 in the microwave plasma processing apparatus 100. In addition, the control program and the recipe of the process conditions or the like may be stored in a computer readable storage medium such as a CD-ROM, a hard disk, a flexible disk, a flash memory, or the like, and downloaded to the memory device 52 from the medium or through a dedicated line from another apparatus.

Next, a plasma etching method according to an embodiment of the present invention is described, with reference to FIGS. 2, 4A, 4B, and 5.

First, the wafer W is transferred by a transfer arm (not shown) into the process chamber 101 through the gate valve 26, placed on the upper surface of the susceptor 105 (See FIG. 2) by moving lifter pins (not shown) upward/downward, and held by the electrostatic chuck 111.

On the upper surface of the wafer W (substrate 11), a patterned etching mask 12 has already been formed (See FIG. 5(a). The etching mask 12 is composed of a $SiO_2$ film or a SiN film, and a width of grooves (trenches) is set to, for example, 65 nm or less. Incidentally, D1 and D2 indicate an area having a high pattern density in the etching mask 12, and I1 and I2 indicate an area having a low pattern density in the etching mask 12, in FIGS. 5(a) and 5(b).

In addition, when the susceptor is provided with a heating portion, the wafer W may be maintained at a predetermined process temperature by the heating portion.

A predetermined process pressure inside the process chamber 101 is set within a range of, for example, 0.01 to several Pa. An etching gas (for example, HBr gas) and a plasma gas (for example, Ar gas) are supplied at corresponding predetermined flow rates from the gas introducing member 15 of the first gas supplying portion 116 and the gas passage 68 of the second gas supplying portion 122, respectively. In addition, the inside of the process chamber 101 is maintained at the predetermined pressure by the evacuation apparatus 24.

In addition, microwaves in the TE mode having a frequency of, for example, 2.45 GHz are generated in the microwave generator 39, propagate to the matching circuit 38 and the rectangular waveguide pipe 37b, and reach the mode converter 40, where the mode of the microwaves is converted to the TEM mode. The microwaves in the TEM mode propagate through the coaxial waveguide pipe 37a and reach the wavelength shortening member 33 through the center electrically conductive member 41 and the outer electrically conductive member 37c. Here, the wavelength of the microwaves is shortened by the wavelength shortening member 33. The microwaves are introduced into a process space (plasma space) SP below the slot plate 31 through the microwave emitting holes 32 of the slot plate 31 and then the microwave permeable plate 28. With this, the etching gas and the plasma gas are activated by the plasma in the process space (plasma space) SP, and plasma etching is performed by the activated etching gas.

In the plasma etching method according to this embodiment of the present invention, the bias electric power controlling portion 113d controls the alternating current bias electric power of the alternating current power supplier 113b so that a ratio of a time period during which the alternating current power supplier 113b supplies alternating current bias electric power to the susceptor 105 with respect to a total time of the time period during which the alternating current power supplier 113b supplies alternating current bias electric power to the susceptor 105 and a time period during which the alternating current power supplier 113b limits the alternating current bias electric power supplied to the susceptor 105 or stops supplying the alternating current bias electric power becomes 0.5. In the following explanation, the time period during which the alternating current power supplier 113b supplies the alternating current bias electric power is referred to as ON time, and the time period during which the alternating current power supplier 113b limits or stops the alternating current bias electric power is referred to as OFF time.

Namely, the bias electric power controlling portion 113d controls the alternating current power supplier 113b so that a step of facilitating etching the wafer W, wherein an alternating bias electric power P1 (first supplying electric power) is supplied to the susceptor 105 from the alternating electric power source 113b serving as the bias electric power supplying portion during an ON time T1 (FIG. 4A), and a step of impeding etching the wafer W, wherein an alternating bias electric power P2 (second supplying electric power) that is lower than the alternating bias electric power P1 is supplied to the susceptor 105, or supplying the alternating bias electric power P1 is terminated during an OFF time T2 (FIG. 4A), are alternately repeated. Such control is carried out so that a duty ratio of the ON time T1 with respect to a total time (T1+T2) of the ON time T1 and the OFF time T2 is 0.5 or less. Namely, a relationship of T1 ≤T2 is held as shown in FIG. 4A.

Next, a plasma etching method carried out by using the plasma etching apparatus according to this embodiment is explained.

According to the inventors' knowledge, a primary factor that causes a problem of difficulties of yielding the same depth and profile in plasma etching in a conventional STI process and a problem of sub-trench shapes that may be formed in the bottom of the groove (trench) resides in adsorption of by-products, which are produced in the etching, on the silicon substrate (semiconductor wafer). Therefore, a primary advantage of the plasma etching process according to this embodiment is brought about by sequentially evacuating the by-products in order to impede the by-products from being adsorbed on the silicon substrate (semiconductor wafer).

Figure 4A:
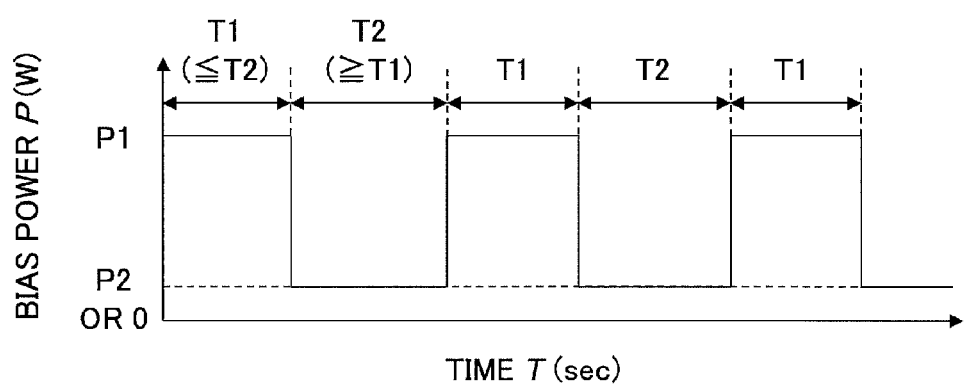
FIG. 4A is an explanatory view for explaining a plasma etching method according to an embodiment of the present invention.
Figure 4B:
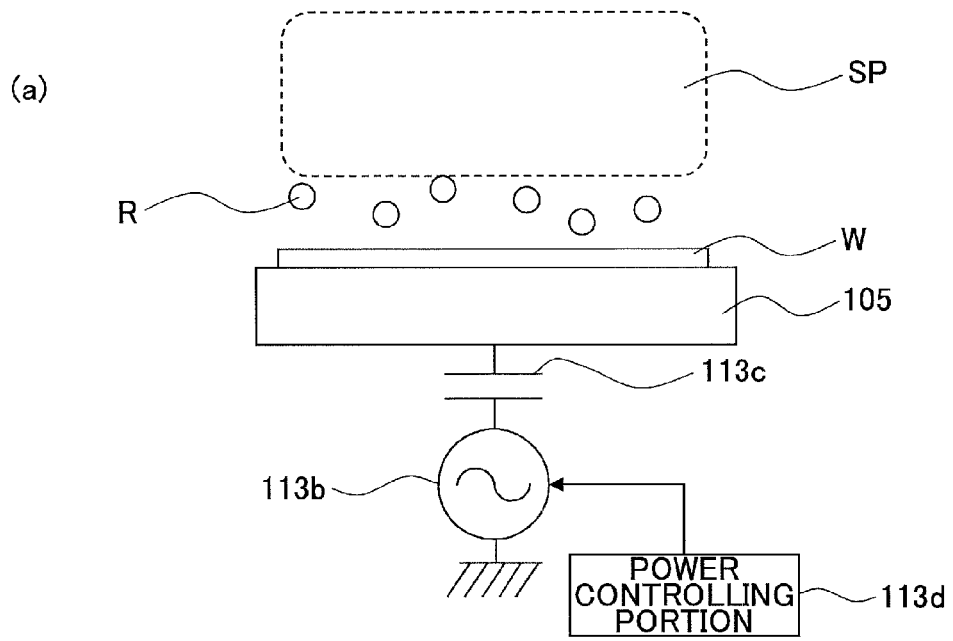
FIG. 4B schematically illustrates advantages of the plasma etching method according to an embodiment of the present invention.
Figure 4B:
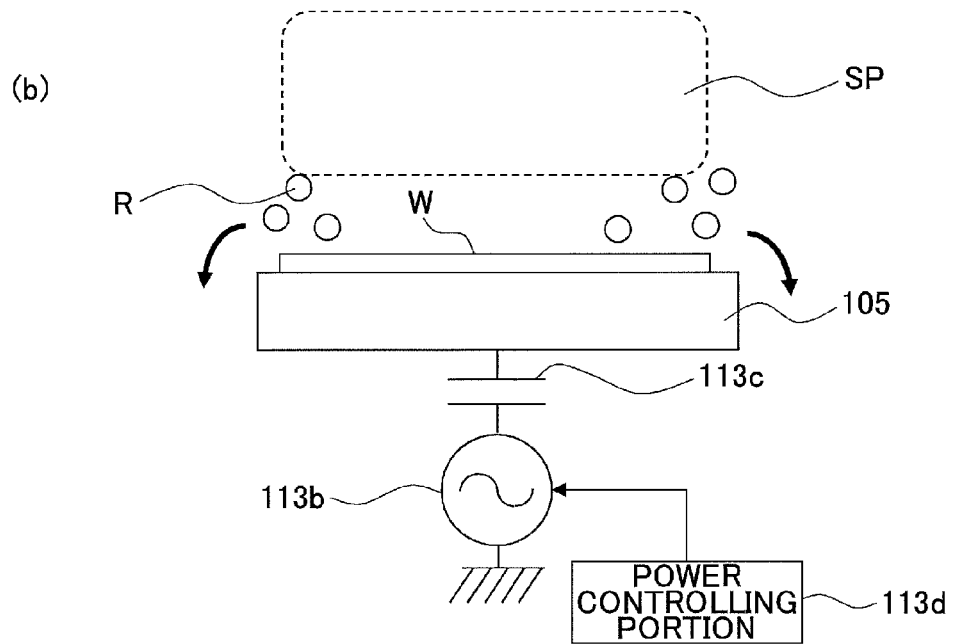
Figure 5:
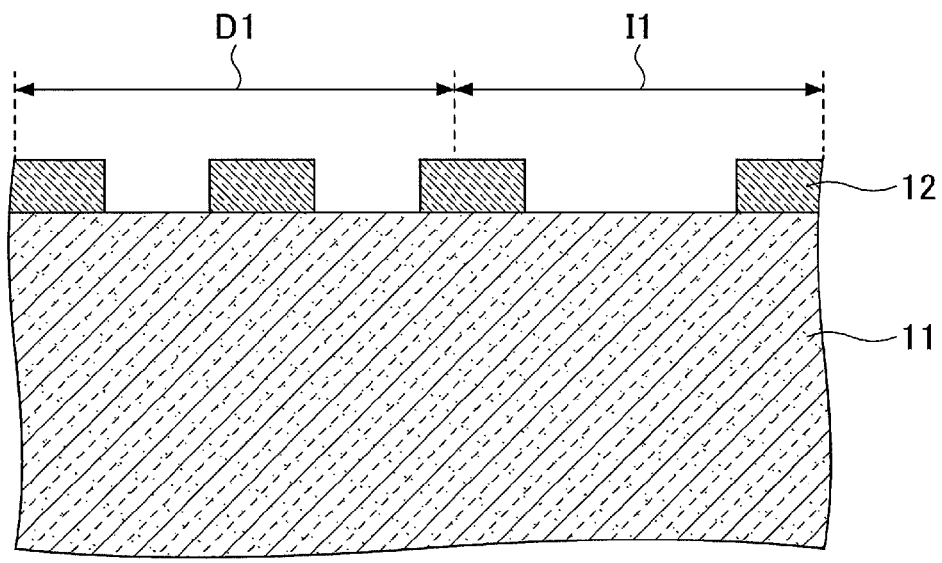
FIG. 5 is an explanatory view for explaining the plasma etching method according to an embodiment of the present invention, illustrating cross sections of a substrate before and after an etching process.
Figure 5:
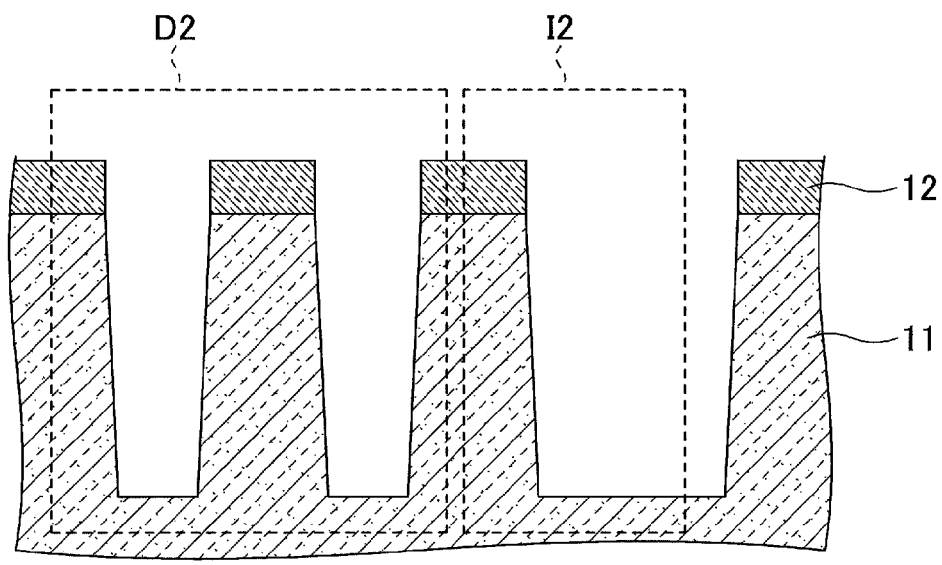

Specifically, the bias electric power controlling portion 113d controls the alternating current power supplier 113b so that the alternating bias electric power P1 to the susceptor 105 during the ON time T1 shown in FIG. 4A. During this ON time T1, the etching process of the wafer W is facilitated as shown FIG. 4B(a). In this case, the by-products R produced from the reaction of the etching gas with the substrate are increased between a plasma space SP and the wafer W. Then, the bias electric power controlling portion 113d controls the alternating current power supplier 113b so that the bias electric power controlling portion 113d supplies the alternating electric bias electric power P2 less than the alternating bias electric power P1 to the susceptor 105, or terminates the alternating bias electric power. During the OFF time T2, the etching process is impeded, as shown in FIG. 4B(b). In addition, the by-products R are reduced because of being evacuated by the evacuation apparatus with the etching gas and the plasma gas supplied thereto. In a conventional continuous wave bias (CW bias) shown in FIG. 1, the by-products remaining un-evacuated in the plasma space SP are dissociated by plasma, turn into etching species (etchant), reach the wafer W, and are adsorbed (deposited) on the wafer W. However, according to this embodiment, the by-products R are reduced during the OFF time T2, and thus an amount of the adsorbed material can be reduced. Therefore, the etching can be carried out while the etching rate and the sub-trench ratio are maintained constant, regardless of the pattern densities, and a center portion and a circumferential portion of the wafer W.

Namely, in order to reduce the by-products R, which are produced during the ON time T1, during the OFF time T2, the duty ratio (T1/(T1+T2)) needs to be a predetermined value or less. As a result of measurements and evaluations described below, the above advantage is obtained when the duty ratio (T1 (T1+T2)) is 0.5 or less.

On the other hand, as long as the by-products R are not adsorbed onto the silicon wafer (semiconductor wafer), there may be considered a method of increasing an evacuation rate of the inside of the process chamber with increased supplying rates of the etching gas and the plasma gas, and a method of adding an oxygen system gas and/or a fluorine system gas to the etching gas such as HBr and $Cl_2$, thereby impeding adsorption of the by-products.

However, the method of increasing the evacuation rate of the inside of the process chamber with increased supplying rates of the etching gas and the plasma gas may be disadvantageous in that gas consumption may be increased, the evacuation apparatus needs to be larger, and electric power consumption may be increased, so that production costs of semiconductor devices and environmental burden are increased. In addition, the method of adding an oxygen system gas and/or a fluorine system gas to the etching gas such as HBr and C12 may be disadvantageous in that an amount of and the number of gases used are increased, so that production costs of semiconductor devices and environmental burden are increased.

Therefore, the plasma etching method and plasma etching apparatus according to embodiments of the present invention, the plasma etching can be realized that yields the same depth and profile regardless of the etching pattern densities, without increasing the amount of and the number of the gases used and increasing the evacuation rate and the flow rate of the etching gas.

(Duty Ratio Dependence)

Evaluation results of evaluation carried out about duty ratio dependence by measuring a trench shape obtained through the plasma etching method according to this embodiment of the present invention are explained with reference to FIGS. 6 through 9.

Etching conditions except for the duty ratio are as follows. The plasma gas is Ar; the etching gas is HBr; a flow rate ratio of Ar/HBr is 850/300 (sccm); a pressure in the process chamber is 100 mTorr. The alternating bias electric power is 200 W and zero W during the ON time T1 and the OFF time T2, respectively. The substrate temperature is 60° C. Repetition frequency of alternately repeating the ON time T1 and the OFF time T2 is 10 Hz. Namely, the total time T1+T2 is 100 ms.

Figure 6:
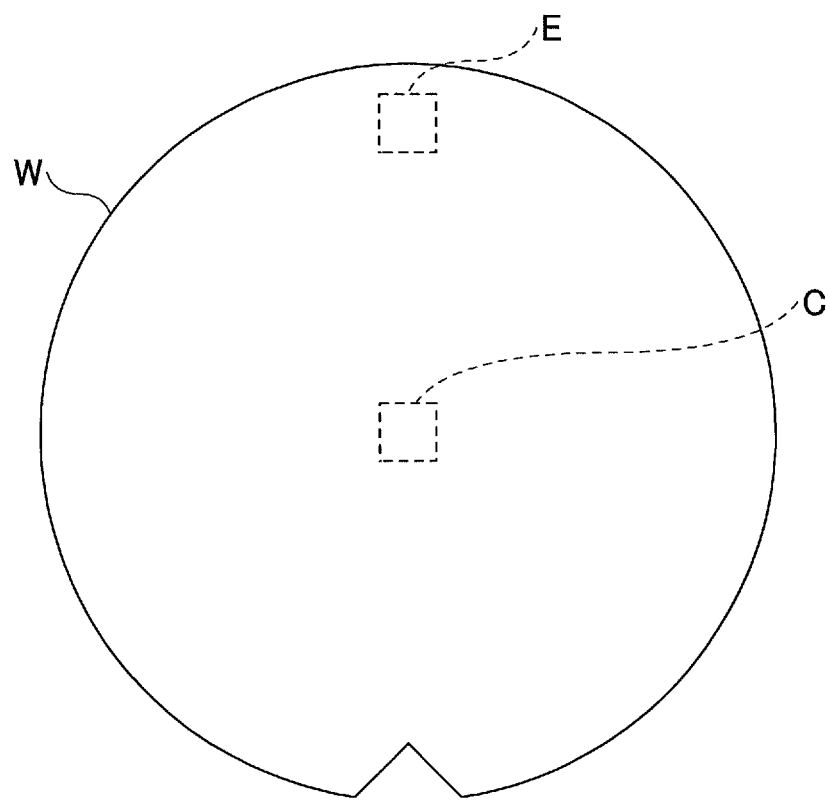
FIG. 6 is an explanatory view for explaining the plasma etching method according to an embodiment of the present invention, illustrating a portion to be evaluated.
Figure 7:
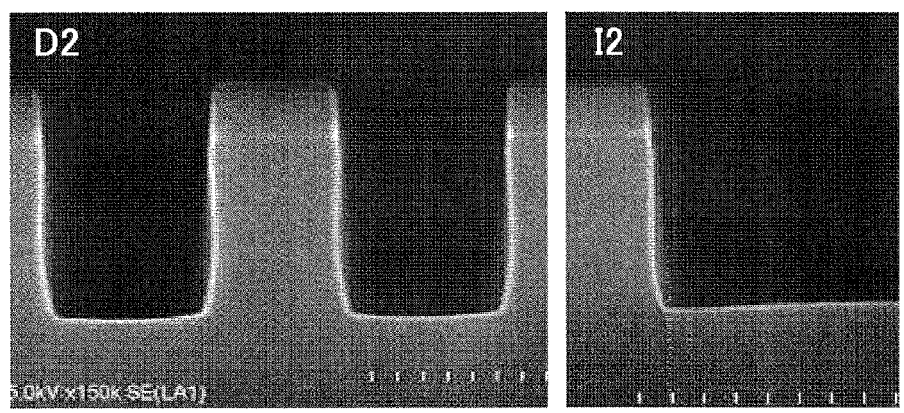
FIG. 7 is an explanatory view for explaining the plasma etching method according to an embodiment of the present invention, which illustrates cross-sectional images of a wafer after the etching process.
Figure 7:
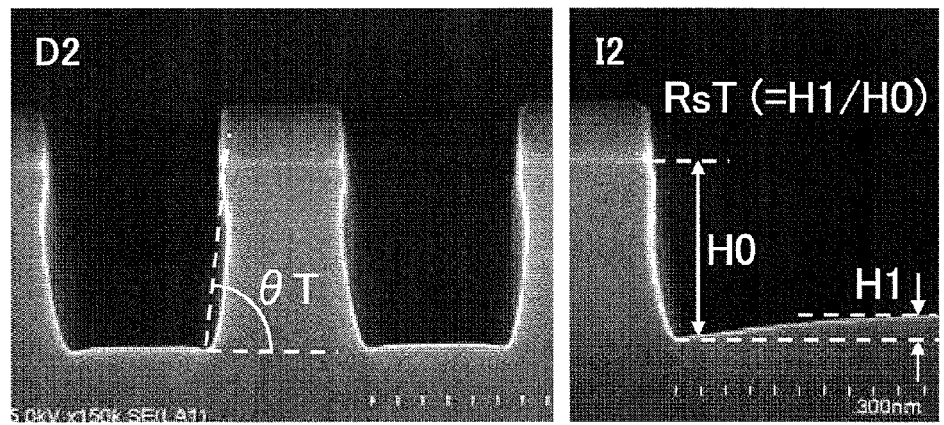

Here, the evaluation of the trench shape in the wafer W is carried out for a center portion C and a circumferential portion E, which are corresponding portions surrounded by dotted lines in FIG. 6. In addition, cross-sectional shapes of the wafer W in the center portion C at the duty ratios of 0.5 and 0.7 are illustrated in FIGS. 7(a) and 7(b). In FIGS. 7(a) and 7(b) "D2" corresponds to the area D2 having a high pattern density in the etching mask shown in FIG. 5(b), and "I2" corresponds to the area I2 having a low pattern density in the etching mask shown in FIG. 5(b). In addition, as shown in FIG. 7(b), a sub-trench ratio Rst is defined as Rst=H1/H0, assuming that a depth of the groove (trench) at the edge portion of the bottom is H0, and a height difference between the center portion of the bottom, which is raised in a convex shape, and the edge portion of the bottom in the groove (trench). Additionally, a taper angle is an angle θt formed between a planar surface linking the edge portion of the bottom and an edge of the opening of the groove (trench) and a horizontal surface.

Figure 8A:
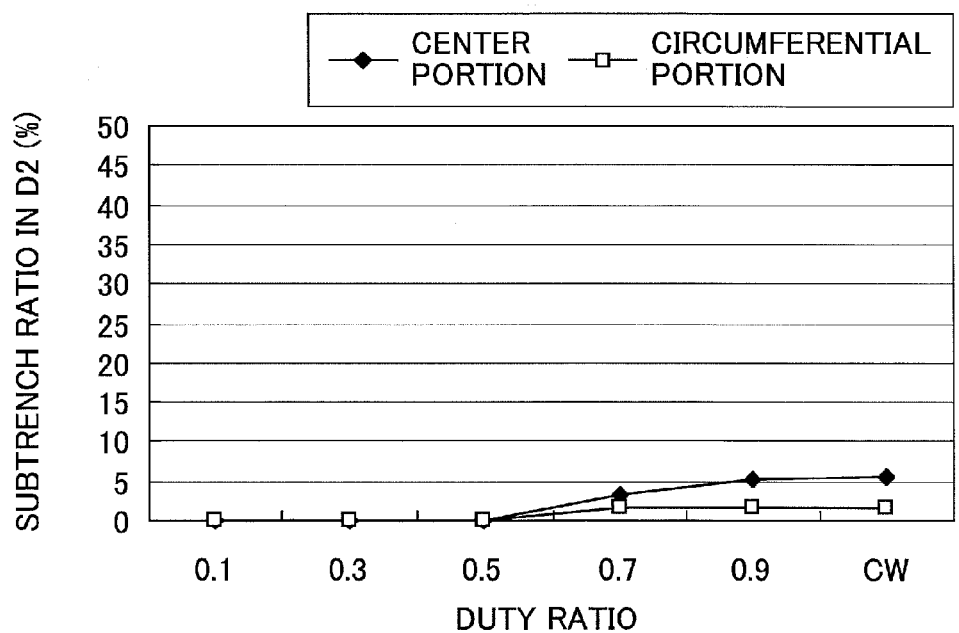
FIG. 8A is an explanatory view for explaining the plasma etching method according to an embodiment of the present invention, which is a graph (part 1) illustrating a duty ratio dependence of trench shapes after the etching process.
Figure 8A:
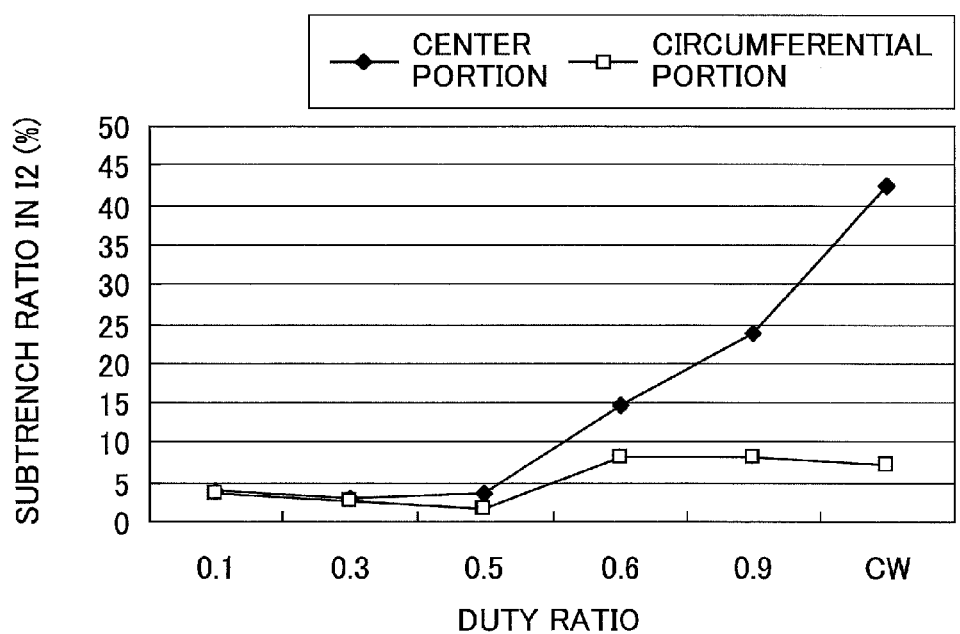
Figure 8B:
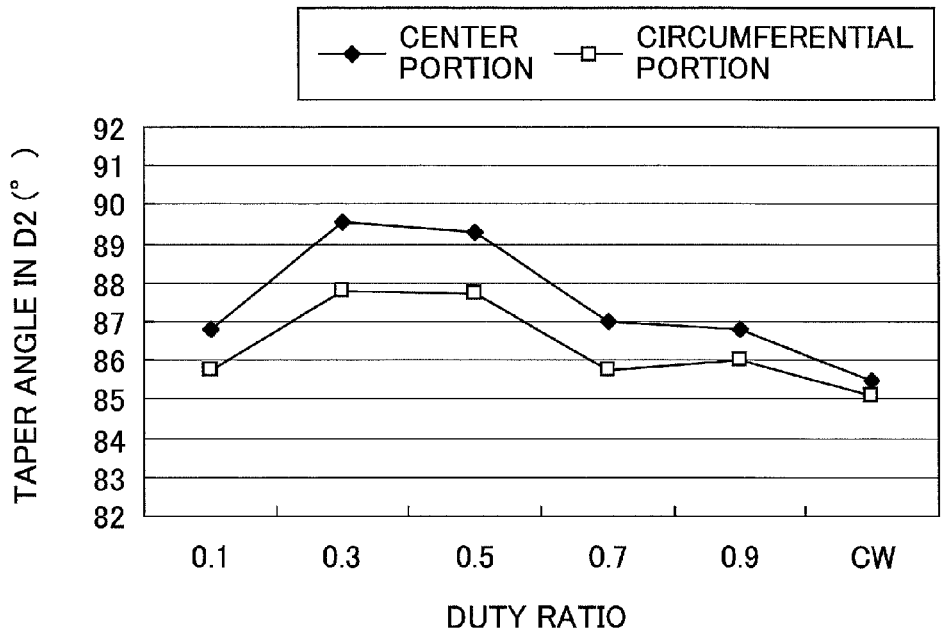
FIG. 8B is an explanatory view for explaining the plasma etching method according to an embodiment of the present invention, which is a graph (part 2) illustrating a duty ratio dependence of trench shapes after the etching process.
Figure 8B:
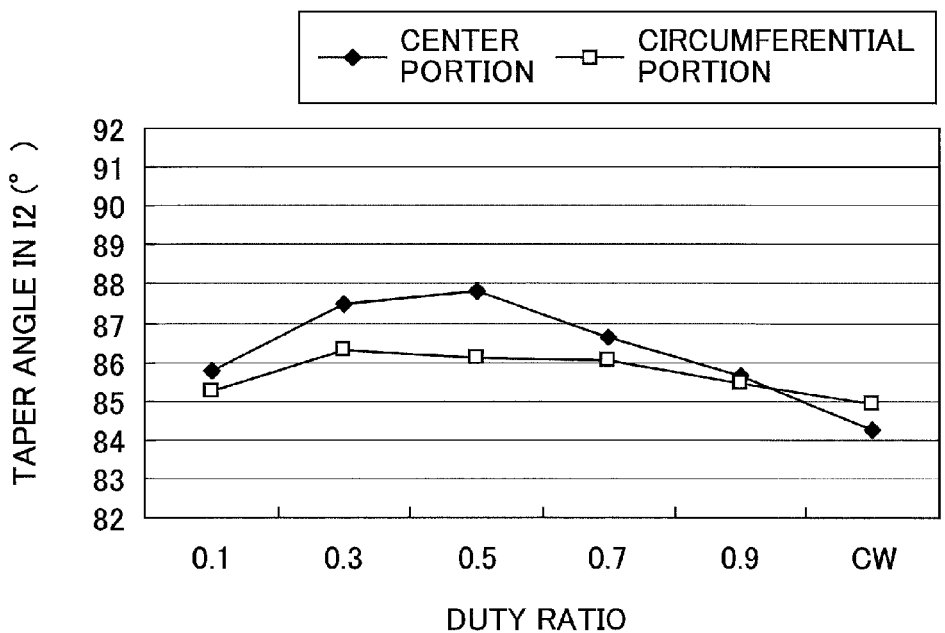

With the sub-trench ratio Rst and the taper angle θt defined as above, FIGS. 8A and 8B summarize the sub-trench shapes when the duty ratios are changed in a range of 0.1, 0.3, 0.5, 0.7, 0.9, and 1.0. Here, the duty ratio of 1.0 corresponds to continuous wave bias control (CW control) rather than the pulse wave bias control (PW control). FIGS. 8A(a) and 8B(b) illustrate a duty ratio dependence of the sub-trench ratio in the areas of high and low pattern densities in the etching mask, respectively. FIGS. 8B(c) and 8B(d) illustrate a duty ratio dependence of the taper angle in the areas of high and low pattern densities in the etching mask.

As shown in FIGS. 8A(a) and 8B(b), the sub-trench ratio becomes 0.05 or less, namely substantially zero in a duty ratio range of 0.5 or less, regardless of the pattern densities in the etching mask and the center and the circumferential portions of the wafer W. In addition, as shown in FIGS. 8B(c) and 8B(d), the taper angle becomes 85° or more in a duty ratio range of 0.5 or less, and 86° or more, namely substantially 90° especially in the duty ratio range of 0.3 or more and 0.5 or less.

In addition, when compared with the CWs (continuous wave bias control modes) shown in FIGS. 8A(a) through 8B (d), the sub-trench ratio is decreased and the taper angle is increased in the duty ratio range of 0.5 or less, and especially in the duty ratio range of 0.3 or more and 0.5 or less.

Figure 9:
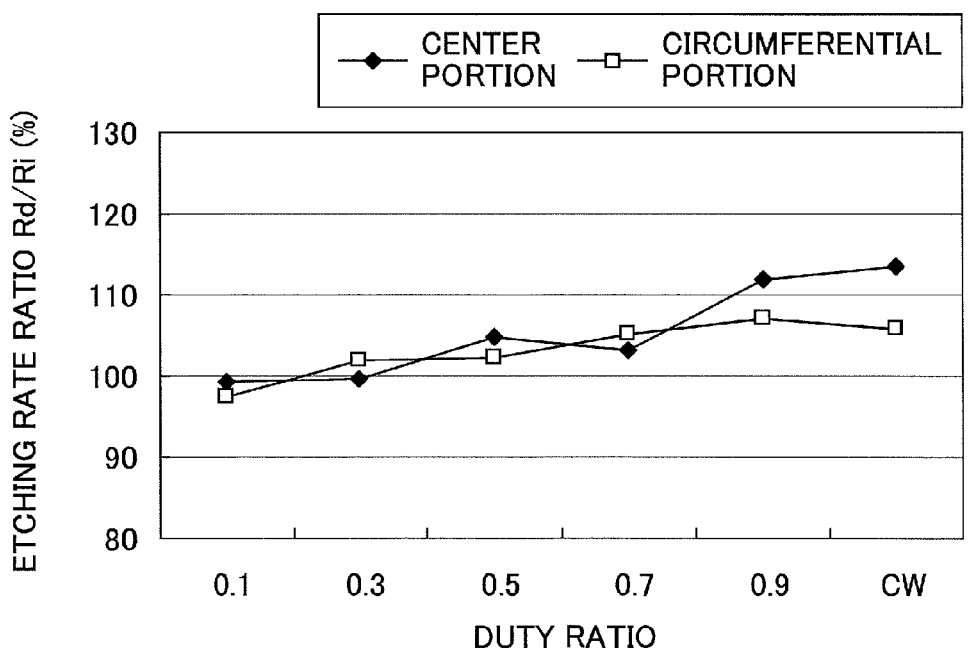
FIG. 9 is an explanatory view for explaining the plasma etching method according to an embodiment of the present invention, which is a graph illustrating a duty ratio dependence of an etching rate ratio.
Figure 9:
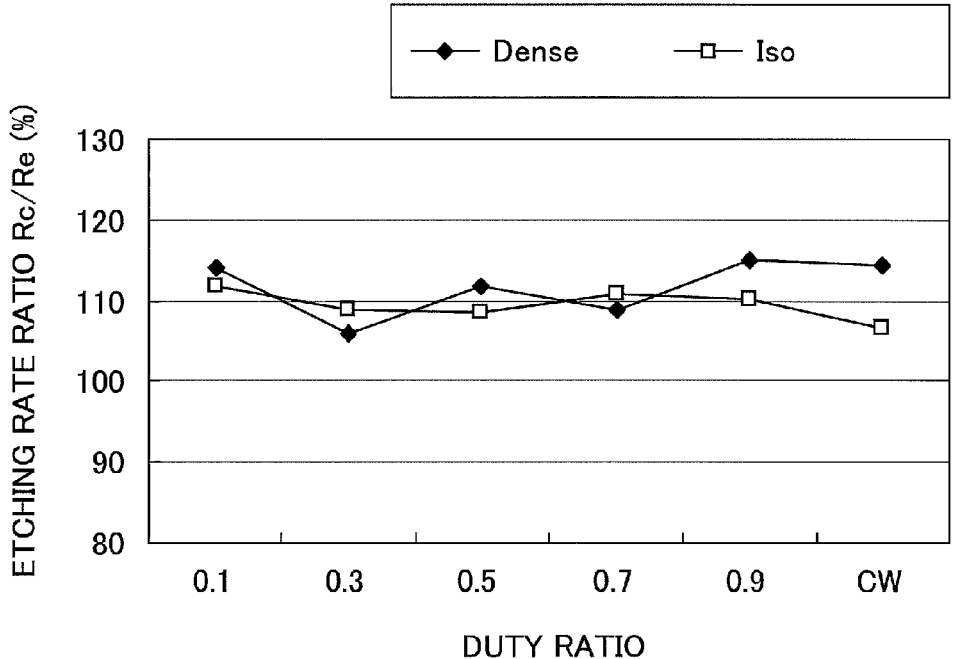

Moreover, the etching rates at the duty ratios of 0.1, 0.3, 0.5, 0.7, 0.9, and 1.0 are shown in FIG. 9. FIG. 9(a) illustrates a ratio of an etching rate Rd in the area having a high pattern density in the etching mask with respect to an etching rage Ri in the area having a low pattern density in the etching mask. FIG. 9(b) illustrates a ratio of an etching rate Rc in the center portion of the wafer W with respect to an etching rate Re in the circumferential portion of the wafer W.

As shown in FIGS. 9(a) and 9(b), the etching rates are substantially the same in the duty ratio range of 0.5 or less, regardless of the pattern densities in the etching mask and the center and the circumferential portions of the wafer W.

From the foregoing, the sub-trench ratio and the taper angle can be maintained substantially constant while the etching rate is maintained substantially constant, in the center portion and the circumferential portion of the wafer W, regardless of the pattern densities in the etching mask, by adjusting the duty ratio of the ON time T1 with respect to the total time T1+T2 to 0.5 or less.

(Repetition Frequency)

Next, a repetition frequency dependence of the trench shape is explained with reference to FIGS. 10A and 10B, when the plasma etching method according to this embodiment of the present invention.

Etching conditions except for the repetition frequency are as follows. The plasma gas is Ar; the etching gas is HBr; a flow rate ratio of Ar/HBr is 850/300 (sccm); a pressure in the process chamber is 10 mTorr. The alternating bias electric power is 1800 W and 200 W during the ON time T1 and the OFF time T2, respectively. The substrate temperature is 60° C. Repetition frequency of alternately repeating the ON time T1 and the OFF time T2 is 10 Hz.

Figure 10A:
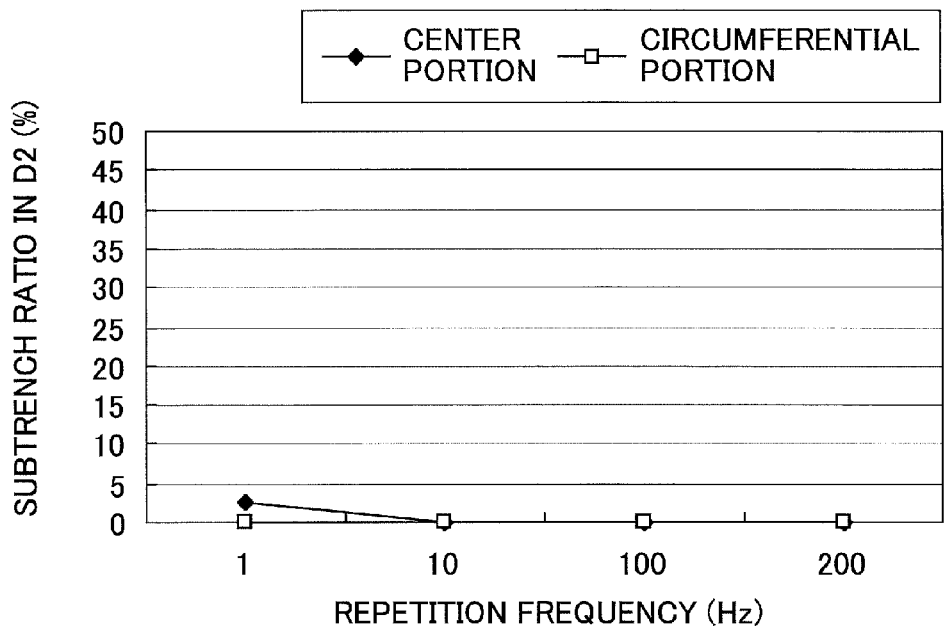
FIG. 10A is an explanatory view for explaining the plasma etching method according to an embodiment of the present invention, which is a graph (part 1) illustrating a repetition frequency dependence of trench shapes after the etching process.
Figure 10A:
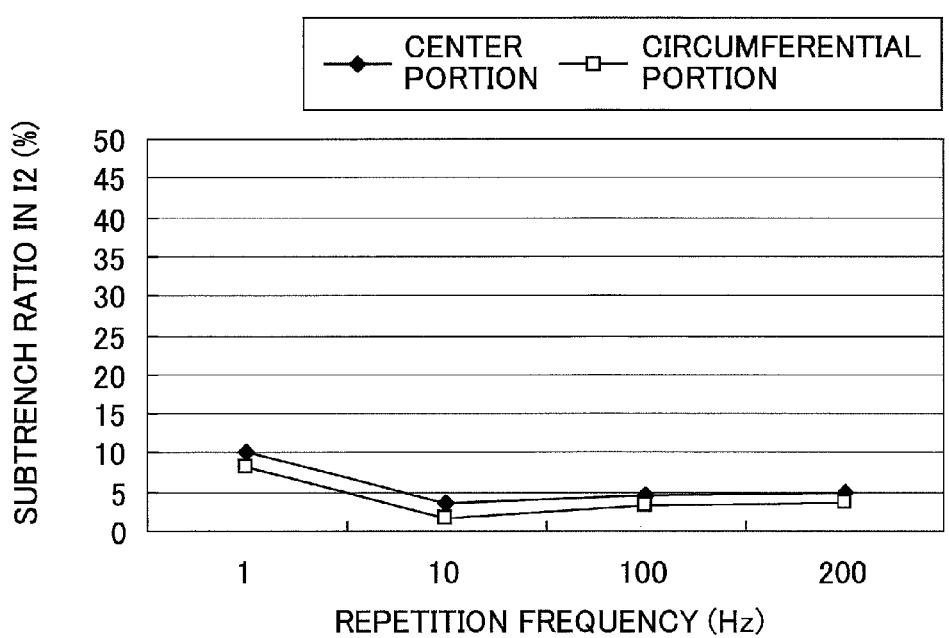
Figure 10B:
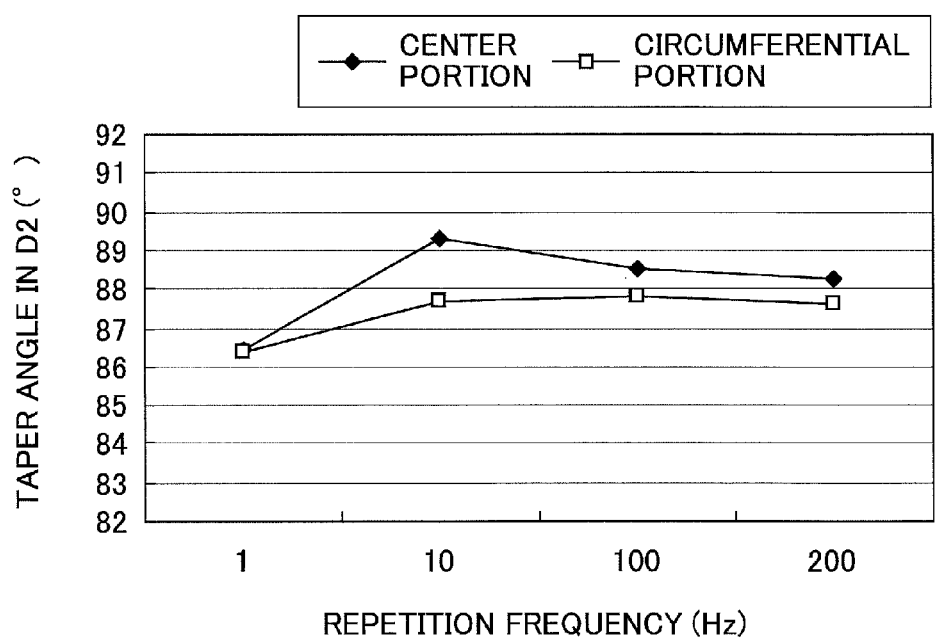
FIG. 10B is an explanatory view for explaining the plasma etching method according to an embodiment of the present invention, which is a graph (part 1) illustrating a repetition frequency dependence of trench shapes after the etching process.
Figure 10B:
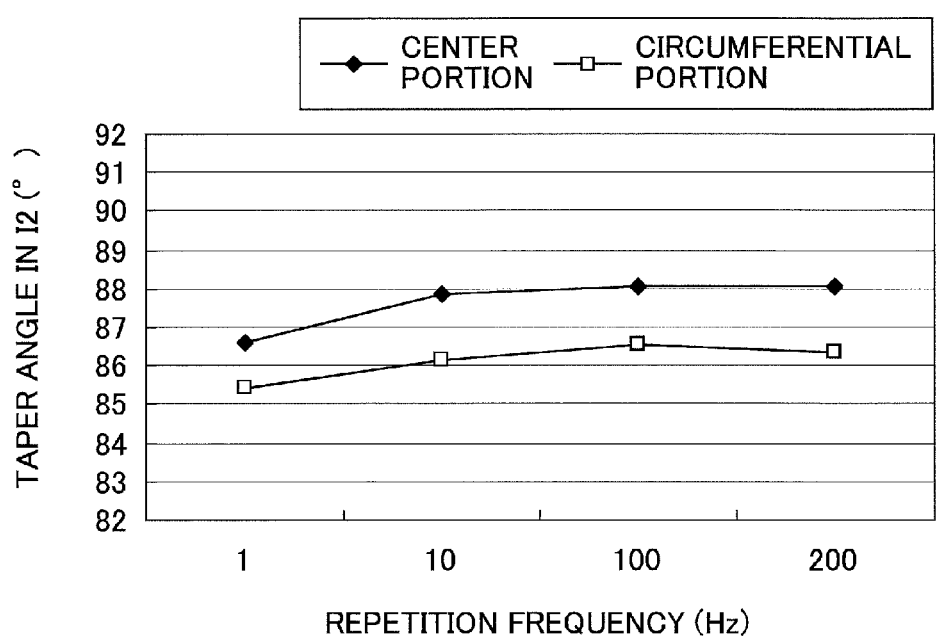

Here, FIGS. 10A and 10B summarize the sub-trench shapes when the repetition frequency is changed at 1 Hz, 10 Hz, 100 Hz, and 200 Hz. FIGS. 10A(a) and 10A(b) illustrate repetition frequency dependences of the sub-trench ratio in the area having a high pattern density and in the area having a low pattern density, respectively. FIGS. 10B(c) and 10B(d) illustrate repetition frequency dependences of the taper angle in the area having a high pattern density and in the area having a low pattern density, respectively.

As shown in FIGS. 10A(a) and 10A(b), the sub-trench ratio becomes 0.1 or less in a repetition frequency range of 1 Hz or more and 200 Hz or less, and 0.05 or less, namely substantially zero, especially in a repetition frequency range of 10 Hz and its vicinity, regardless of the pattern densities and the center and the circumferential portions of the wafer W. In addition, as shown in FIGS. 10B(c) and 10B(d), the taper angle becomes 85° or more in a repetition frequency range of 1 Hz or more and 200 Hz or less, and 86° or more, namely substantially 90° in a repetition frequency of 10 Hz and its vicinity, regardless of the pattern densities and the center and the circumferential portions of the wafer W.

In addition, when compared with the duty ratio of 0.5 or more and the CWs (continuous wave bias control mode), which are shown in FIGS. 10A(a) through 10B(d), the sub-trench ratio is reduced and the taper angle is increased, in a repetition frequency of 1 Hz or more and 200 Hz or less.

From the foregoing, the sub-trench ratio and the taper angle can be maintained substantially constant while the etching rate is maintained substantially constant, in the center portion and the circumferential portion of the wafer W, regardless of the pattern densities in the etching mask, by adjusting the repetition frequency of alternately repeating the ON time T1 and the OFF time T2 to 1 Hz or more and 200 Hz or less, more preferably to 10 Hz and its vicinity.

(Pressure Dependence)

Next, a pressure dependence of the trench shape is explained with reference to FIGS. 11 and 12, when the plasma etching method according to this embodiment of the present invention is employed.

Etching conditions except for the duty ratio are as follows. The plasma gas is Ar; the etching gas is HBr; and a flow rate ratio of Ar/HBr is 850/300 (sccm). The alternating bias electric power is 200 W and zero W during the ON time T1 and the OFF time T2, respectively. The substrate temperature is 60° C. The duty ratio (T1/(T1+T2)) of the ON time T1 and the OFF time T2 is 0.5. The repetition frequency of alternately repeating the ON time T1 and the OFF time T2 is 10 Hz.

Figure 11:
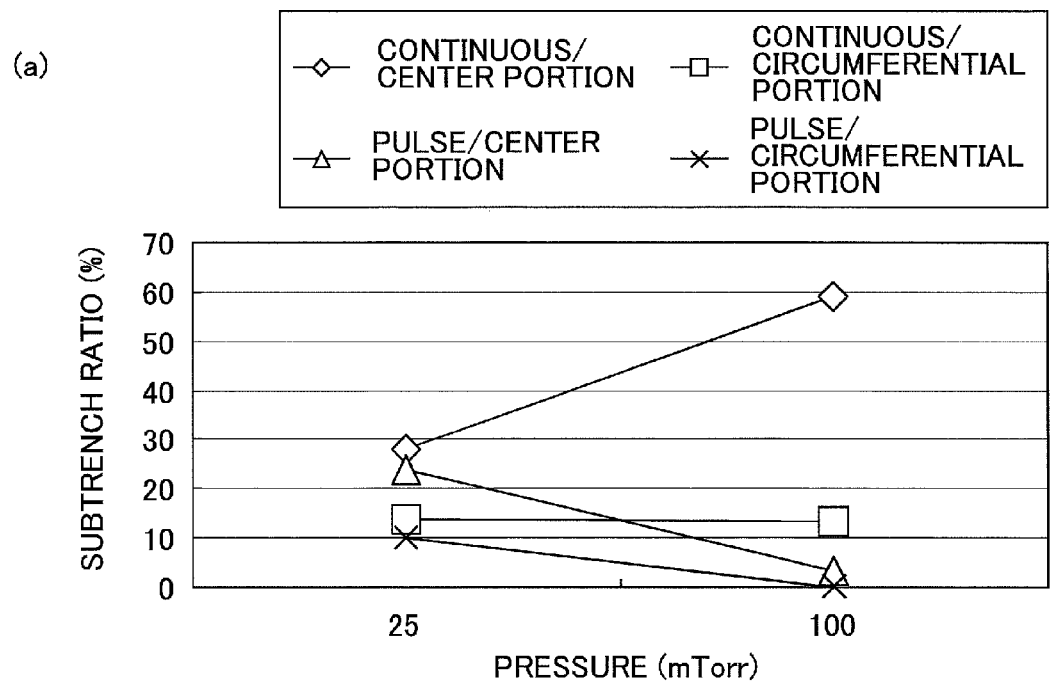
FIG. 11 is an explanatory view for explaining the plasma etching method according to an embodiment of the present invention, which is a graph (part 1) illustrating a pressure dependence of trench shapes after the etching process.
Figure 11:
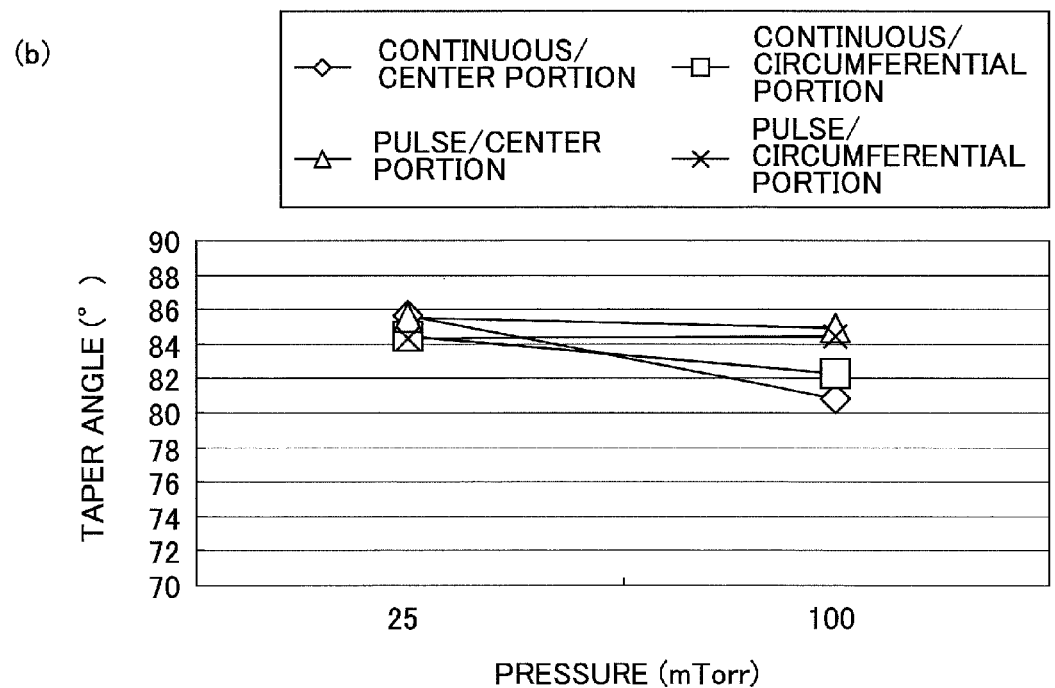
Figure 12:
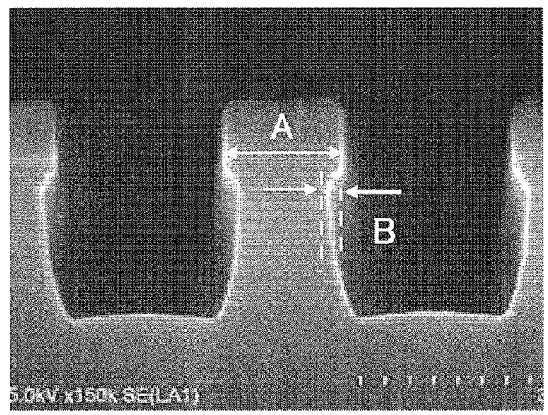
FIG. 12 is an explanatory view for explaining the plasma etching method according to an embodiment of the present invention, which is a graph (part 1) illustrating a pressure dependence of side etch width after the etching process.
Figure 12:
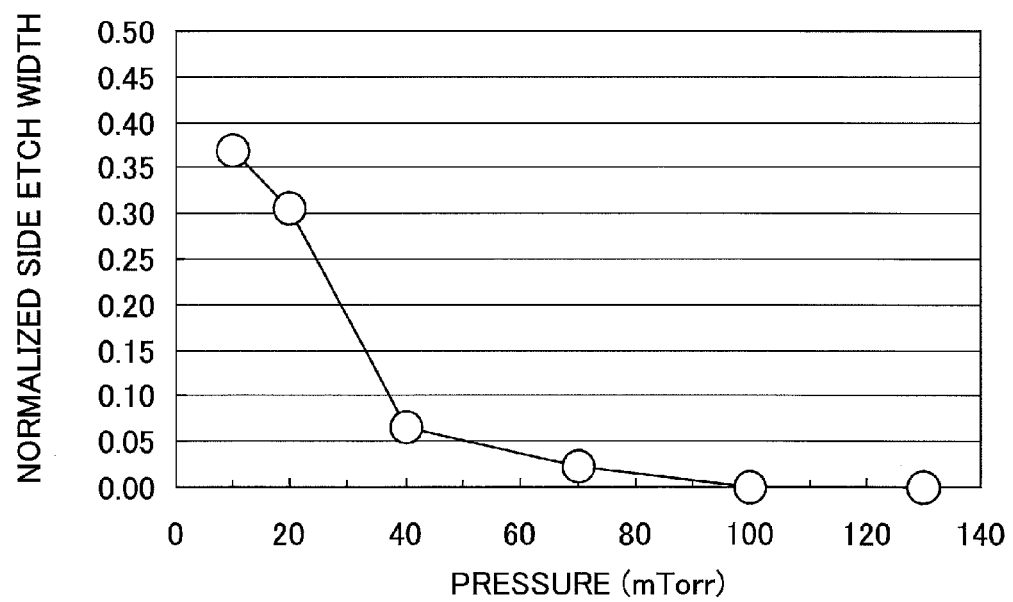

Here, FIG. 11 summarizes the pressure dependence of the trench shape when the pressure in the process chamber is changed in a range of 25 mTorr or more and 100 mTorr or less. FIGS. 11(a) and 11(b) illustrate a pressure dependence of the sub-trench ratio and the taper angle. Incidentally, FIGS. 11(a) and 11(b) also illustrate the pressure dependences in the case of CW (continuous wave) bias control, for comparison.

As shown in FIG. 11 (a), the sub-trench ratio becomes 0.25 or less in a pressure range of 25 mTorr or more and 100 mTorr or less, and the sub-trench ratio becomes smaller by the CW (continuous wave) bias control, regardless of the pattern densities and the center and the circumferential portions of the wafer W. In addition, as shown in FIG. 11(b), the taper angle becomes 84° or more in a pressure range of 25 mTorr or more and 100 mTorr or less, and the taper angle becomes greater by the CW (continuous wave) bias control, regardless of the pattern densities and the center and the circumferential portions of the wafer W.

Next, an experiment carried out in order to examine a normalized side etching width when the pressure is changed in a range of 10 mTorr or more and 130 mTorr or less. FIG. 12(a) illustrates a cross-sectional view of a trench in order to explain definition of the side etching width. FIG. 12(b) illustrates a pressure dependence of a normalized side etching width obtained by normalizing a side etching width B with a width A of a wall between the trenches.

As shown in FIG. 12(b), the normalized side etching width becomes 0.3 or more in a pressure range of 10 mTorr or more and 20 mTorr or less in the process chamber, which indicates that a trench wall is relatively largely indented, as shown in FIG. 12(a). It is thought that isotropic etching is facilitated in a lower pressure range so that the inner wall of the trench is etched, because etching gas molecules (or radicals) activated by plasma are less likely to lose their activity due to a longer mean free path.

On the other hand, as shown in FIG. 12(b), the normalized side etching width becomes 0.1 or less, namely substantially zero in a pressure range of 40 mTorr or more and 130 mTorr or less in the process chamber. This is because the etching gas molecules (and/or radicals) activated by plasma may moderately lose activity because of relatively short mean free path in a higher pressure range, and thus isotropic etching is carried out without laterally etching the side wall of the trench. Therefore, when the side etching width is considered as a criterion for the trench shape, the pressure is preferably set to 40 mTorr or more and 130 mTorr or less in order to form the trench having a more preferable shape.

In addition, when the pressure is set to be relatively higher, for example, 70 mTorr or more, an electron temperature is sufficiently reduced over the wafer, a density of the active radicals is reduced, and the by-products are impeded from being re-dissociated, thereby preventing the etching profile from being degraded during the OFF time, and the by-products from being adsorbed.

Incidentally, no pressure dependence is observed in the sub-trench ratio and the taper angle in a pressure range of 100 mTorr or more, and the sub-trench ratio and the taper angle have substantially the same values as the sub-trench ratio and the taper angle at the pressure of 100 mTorr, respectively, although not shown. This is thought to be because the plasma can stably exist in a pressure range of 100 mTorr, or even in several Torr, for example. In addition, no pressure dependence is observed in the etching width in a pressure range of 130 mTorr or more in the process chamber, and the etching width has substantially the same value as the etching width at 30 mTorr. This is thought to be due to that, while the side etching width becomes zero because the activated etching gas molecules moderately lose activity because of a relatively short mean free path, the plasma can stably exist even at several Torr, for example. Therefore, the pressure in the process chamber may be 40 mTorr or more, preferably 70 mTorr or more, and more preferably 70 mTorr or more and 130 mTorr or less.

In addition, the microwave electric power emitted from the RLSA is supplied into the process chamber to which the etching gas and the plasma gas are supplied, thereby carrying out the etching in the plasma etching system according to this embodiment. The RLSA microwave plasma system can generate plasma in a wider pressure range, when compared with other plasma excitation systems such as an ECR plasma system, a Capacitively Coupled Plasma (CCP) plasma system, and the like. Therefore, according to the plasma etching method of this embodiment, the etching process can be more stably carried out in a pressure range of 40 mTorr or more.

With this, electric power consumption of the evacuation apparatus 24 serving as the evacuation portion and the control portion can be reduced.

From the foregoing, the sub-trench ratio and the taper angle are maintained substantially constant and the side etching width can be close to zero in the center and the circumferential portions of the wafer W, regardless of the pattern densities in the etching mask by setting the pressure to be 40 mTorr or more, preferably 70 mTorr or more, and more preferably 70 mTorr or more and 130 mTorr or less, in the plasma etching method according to this embodiment of the present invention.

(Gas Flow Rate Dependence)

Next, a dependence of the trench shape on a gas flow rate of the plasma gas and the etching gas when the plasma etching method according to this embodiment is explained with reference to FIG. 13.

Figure 13:
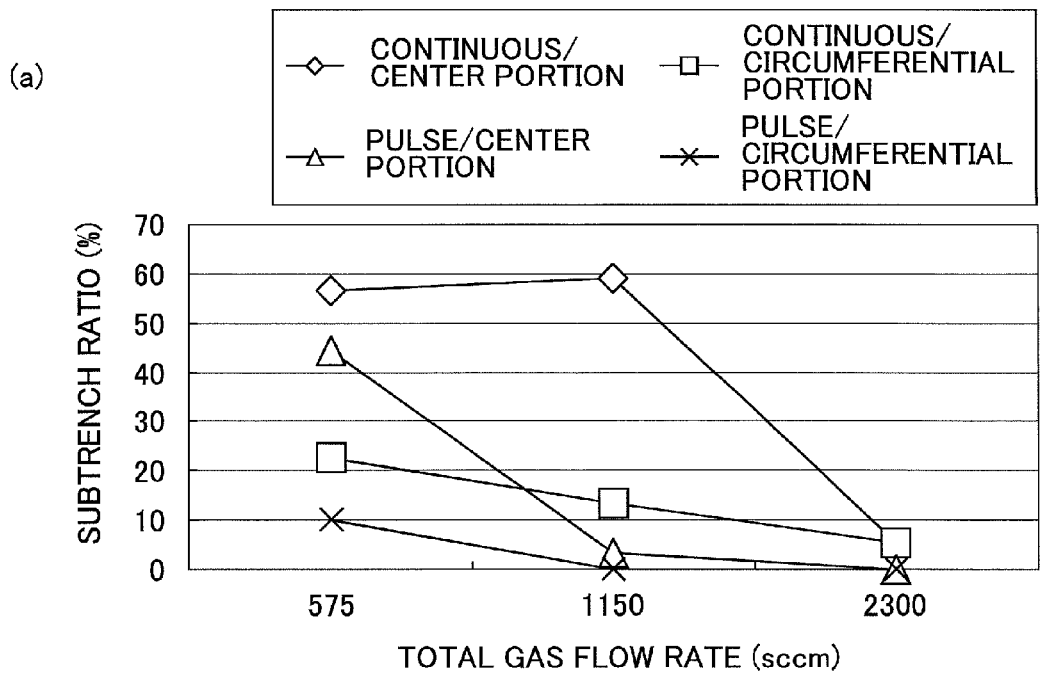
FIG. 13 is an explanatory view for explaining the plasma etching method according to an embodiment of the present invention, which is a graph (part 1) illustrating a gas flow rate dependence of trench shapes after the etching process.
Figure 13:
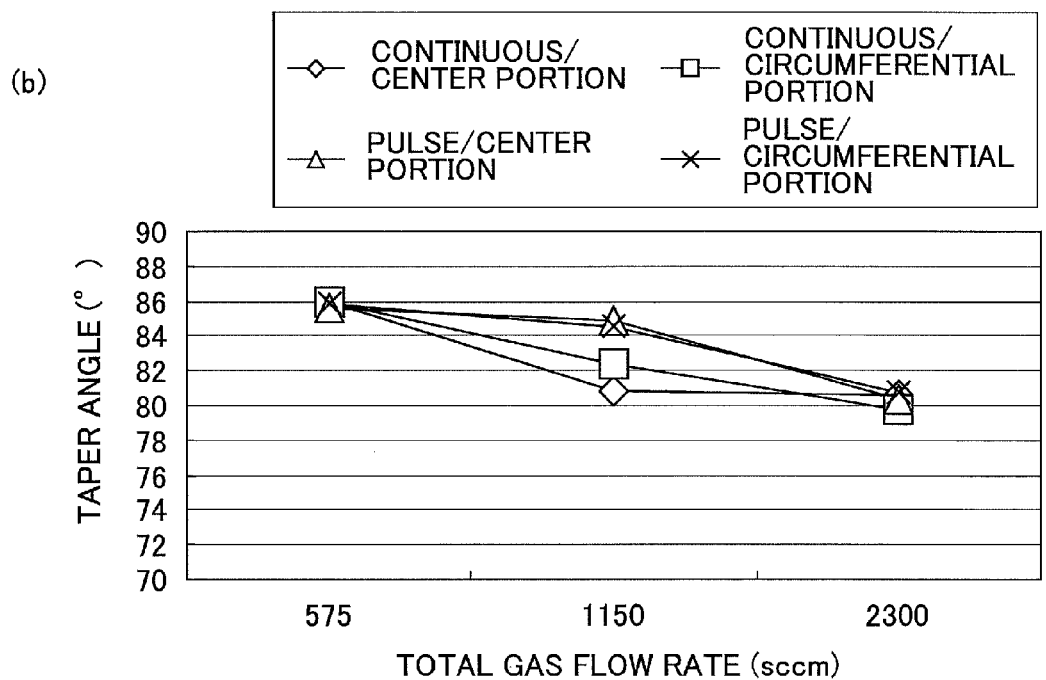

FIG. 13 is an explanatory view for explaining the plasma etching method according to this embodiment, and illustrates the gas flow rate dependence of the trench shape after the etching process.

Etching conditions except for the pressure in the process chamber are as follows. The plasma gas is Ar and the etching gas is HBr. A pressure in the process chamber is 100 mTorr. The alternating bias electric power is 200 W and zero W during the ON time T1 and the OFF time T2, respectively. The substrate temperature is 60° C. The duty ratio (T1/(T1+T2)) of the ON time T1 and the OFF time T2 is 0.5. Repetition frequency of alternately repeating the ON time T1 and the OFF time T2 is 10 Hz.

Here, FIG. 13 illustrates the flow rate dependence of the trench shapes when the total flow rate is changed in a range of 575 sccm (Ar/HBr=425/150 sccm), 1150 sccm (Ar/HBr=850/300 sccm), 2300 sccm (Ar/HBr=1700/600 sccm), while the flow rate ratio of Ar/HBr is maintained constant. FIGS. 13(a) and 13(b) illustrate the pressure dependence of the sub-trench ratio and the taper angle, respectively. Incidentally, FIGS. 13(a) and 13(b) also illustrate the flow rate dependence in the case of the CW (continuous wave) bias control, for comparison.

As shown in FIG. 13(a), the sub-trench ratio becomes 0.5 or less in a total flow range of 575 sccm or more and 2300 sccm or less, and 0.05 or less and less than that obtained by the CW (continuous wave) control especially at the total flow rate range of 1150 sccm and its vicinity, regardless of the etching pattern densities and the center and the circumferential portions of the wafer W. In addition, as shown in FIG. 13(b), the taper angle becomes 80° or more in the total flow range of 575 sccm or more and 2300 sccm or less, and 84° or more, namely substantially 90°, and greater than that obtained by the CW (continuous wave) control, regardless of the etching pattern densities and the center and the circumferential portions of the wafer W.

From the foregoing, the sub-trench ratio and the taper angle can be maintained substantially constant regardless of the etching pattern densities and the center and the circumferential portions of the wafer W, by setting the flow rate of the plasma gas (Ar gas) to 425 sccm or more and 1700 sccm or less and the flow rate of the etching gas (HBr gas) to 150 sccm or more and 600 sccm or less, more preferably the flow rate of the plasma gas (Ar gas) to 850 sccm and its vicinity and the flow rate of the etching gas (HBr) gas to 300 sccm and its vicinity, in the plasma etching method according to this embodiment.

While preferred embodiments of the present invention have been described, the present invention is not limited to the specific embodiments, but may be variously modified or altered within the scope of the accompanying claims.

Incidentally, an embodiment of the present invention may be described as follows.

Namely, one aspect of the present invention provides a plasma etching method comprising:

placing an object to be processed on a susceptor provided in a process chamber that may be maintained at a reduced pressure, the process chamber being provided with a microwave permeable plate made of a dielectric material that allows microwaves to pass therethrough, a slot plate that is made of a conductive material and has plural through holes, the slot plate being arranged above the microwave permeable plate, and a dielectric plate that is made of a dielectric material and arranged above the slot plate;

supplying an etching gas into the process chamber;

maintaining an inside of the process chamber at a predetermined pressure;

introducing microwaves having a predetermined frequency into the process chamber through the electric plate, the slot plate, and the microwave permeable plate in this order, thereby generating plasma in the process chamber; and supplying an alternating bias to the susceptor by repeating a first time period during which the alternating bias is supplied to the susceptor at a first electric power and a second time period during which the alternating bias is supplied to the susceptor at a second electric power that is less than the first electric power so that a ratio of the first time period with respect to a total time period of the first time period and the second time period falls within a range from 0.1 through 0.5.

In addition, the first time period and the second time period are repeated at a repetition frequency in a range from 1 Hz through 200 Hz in the step of supplying the alternating bias in the plasma etching method according to the above aspect.

In addition, the second electric power may be zero in the step of supplying the alternating bias in the plasma etching method according to the above aspects.

Moreover, the predetermined pressure is preferably 40 mTorr or more, and more preferably 70 mTorr in the plasma etching method according to the above aspects.

Furthermore, the plasma etching method according to the above aspects may include a step of supplying a plasma gas. In this case, a flow rate of the plasma gas is preferably 1700 sccm or less. In addition, a flow rate of the etching gas is 600 sccm or less.

Although the above embodiments have been explained taking an example of the semiconductor wafer serving as an object to be processed, the present invention is not limited to this, but may be applied to LCD substrates, glass substrates, ceramic substrates, and the like.

The invention claimed is:

1. A plasma etching apparatus comprising:
   a process chamber whose inside is evacuatable to vacuum and that has an openable ceiling portion;
   a susceptor on which an object to be processed is placed, the susceptor being provided in the process chamber;
   a microwave permeable plate that is made of a dielectric material that allows microwaves to pass therethrough and is attached to an opening of the ceiling portion in an air-tight manner;
   a microwave supplying portion including a microwave generation apparatus that generates microwaves of a predetermined frequency, a mode converter that is connected to the microwave generation apparatus via a rectangular waveguide pipe and a matching circuit and converts an oscillation mode of the generated microwaves into a predetermined mode, a coaxial waveguide pipe that allows the microwaves having the predetermined mode to propagate therein, an electrically conductive chassis that is connected to an outer electrical conductive body of the coaxial waveguide pipe, a slot plate that is made of a conductive material and has plural through holes, wherein the slot plate is arranged in an upper surface of the microwave permeable plate and a center electrically conductive material is connected to a center portion of the slot plate, and a dielectric plate that is made of a dielectric material and arranged between the slot plate and the chassis;
   a gas supplying portion that supplies a process gas to the process chamber;
   an evacuation portion that maintains the inside of the process chamber at a predetermined pressure;
   a bias electric power supplying portion that supplies an alternating bias electric power to the susceptor; and
   an alternating bias electric power control portion that controls the alternating bias electric power,
   wherein the alternating bias electric power control portion controls the alternating bias electric power so that supplying and disconnecting the alternating bias electric power to the susceptor are repeated to allow a ratio of a time period of supplying the alternating bias electric power with respect to a total time period of supplying the alternating bias electric power and disconnecting the alternating bias electric power to be 0.1 or more and 0.5 or less.

2. The plasma etching apparatus recited in claim 1, wherein repetition frequency of alternately repeating supplying and disconnecting the alternating bias electric power by the alternating bias electric power control portion is 1 Hz or more and 200 Hz or less.

3. The plasma etching apparatus recited in claim 1, wherein the pressure in the process chamber is 40 mTorr or more.

4. The plasma etching apparatus recited in claim 1, wherein the pressure in the process chamber is 70 mTorr or more.

5. The plasma etching apparatus recited in claim 1, wherein a frequency of the alternating bias electric power is 13.56 MHz.

* * * * *